US00RE40925E

(19) United States
(12) Reissued Patent
Ly et al.

(10) Patent Number: US RE40,925 E
(45) Date of Reissued Patent: Sep. 29, 2009

(54) METHODS FOR AUTOMATICALLY PIPELINING LOOPS

(75) Inventors: Tai A. Ly, San Jose, CA (US); David W. Knapp, San Jose, CA (US); Ronald A. Miller, Cupertino, CA (US); Donald B. Macmillen, Redwood City, CA (US)

(73) Assignee: Synopsys, Inc., Mountain View, CA (US)

(21) Appl. No.: 09/590,584

(22) Filed: Jun. 8, 2000

(Under 37 CFR 1.47)

Related U.S. Patent Documents

Reissue of:
(64) Patent No.: 5,764,951
Issued: Jun. 9, 1998
Appl. No.: 09/440,554
Filed: May 12, 1995

(51) Int. Cl.
*G06F 17/50* (2006.01)

(52) U.S. Cl. ..... 716/18; 716/1
(58) Field of Classification Search ..... 716/1, 716/18
See application file for complete search history.

(56) References Cited

U.S. PATENT DOCUMENTS 4,827,427 A * 5/1989 Hyduke ..... 364/489
5,111,413 A * 5/1992 Lazansky et al. ..... 364/578
5,128,871 A * 7/1992 Schmitz ..... 364/490
5,237,513 A * 8/1993 Kaplan ..... 364/490
5,274,793 A * 12/1993 Kuroda et al. ..... 395/500
5,437,037 A * 7/1995 Furuichi ..... 395/700
5,544,066 A * 8/1996 Rostoker et al. ..... 364/489
5,572,437 A * 11/1996 Rostoker et al. ..... 364/489
6,044,023 A * 3/2000 Proebsting ..... 365/189.01

OTHER PUBLICATIONS

Ly et al., Scheduling Using Behavioral Templates, Proceedings of the 32nd ACM/IEEE Conference on Design Automation, p. 101–106, Jan. 1995.*
Knapp et al., Behavioral Synthesis Methodology for HDL–Based Specification and Validation, Proceedings of the ACM/IEEE Conference on Design Automation, pp. 286–291, Jan. 1995.*
A Stoll et al., Flexible Timing Specification in a VHDL Synthesis Subset, EURO–DAC Design Automation Conference, pp. 610–615, Sep. 1992.*
Y. Hu et al., Lower Bounds on the Iteration Time and the Number of Resources for Functional Pipelined Data Flow Grpahs, IEEE International Conference on Computer Design: VLSI in Computers and Processors, pp. 21–24, Oct. 1993.*
M. Koster et al., ASIC Using the High–Level Synthesis System CALLAS: A Case Study, 1990 IEEE International Conference on Computer Design: VLSI in Computers and Processors, pp. 141–146, Sep. 1990.*
R. Camposano et al., VHDL as Input for High–Level Synthesis, IEEE Design & Test of Computers, vol. 8, Issue 1, pp. 43–49, Mar. 1991.*
F. Brewer et al., Chippe: A System for Constant Driven Behavioral Synthesis, IEEE Computer–Aided Design of Integrated Circuits and Systems, vol. 9, Issue 7, pp. 681–695, Jul. 1990.*

(Continued)

*Primary Examiner*—Leigh Marie Garbowski
(74) *Attorney, Agent, or Firm*—Park, Vaughan & Fleming LLP

(57) ABSTRACT

A method and an apparatus for creating a representation of a circuit with a pipelined loop from an HDL source code description. It infers a circuit including a pipelined loop which has cycle level simulation behavior matching that of the source HDL. Loop carry dependencies and memory and signal I/O accesses within the loop are scheduled correctly.

40 Claims, 35 Drawing Sheets

OTHER PUBLICATIONS

D.A. Lobo et al., Generating Pipelined Datapaths Using Reduction Techniques to Shorten Critical Paths, 1992 EURO–DAC Design Automation Conference, pp. 390–395, Sep. 1992.*

C.–T. Hwang et al., A Formal Approach to the Scheduling Problem in High Level Synthesis, IEEE Transactions on Comput r–Aided Design of Integrated Circuits and Systems, vol. 10, Issue 4, Apr. 1991.*

K. Kukcakar et al., CHOP: A Constraint–Driven System Level Partioner, Proceedings of the 28$^{th}$Conference on ACM/IEEE Design Automation, pp. 514–519, Jun. 1991.*

A. Stoll et al., High–Level Synthesis from VHDL with Exact Timing Constraints, Proceedings of the 29$^{th}$ACM/IEEE Confer nc on Design Automation, pp. 188–193, Jul. 1992.*

C–T et al., Scheduling for Functional Pipelining and Loop Winding, Proceedings of the 28th Conference on ACM/IEE Design Automation Conference, pp. 764–769, Jun. 1991.*

N. When et al., Scheduling of Behavioral VHDL by Retiming Techniques, Proceedings of the 1994 Conference of Europ an Design Automation, pp. 546–551, Sep. 1994.*

M. Valle et al., A VHDL–based Design Methodology: The Design Experience of a High Performance ASIC Chip, Proceedings o the 1994 Conference on Design Automation, pp. 664–669, Sep. 1994.*

R. Camposano et al., Synthesis Circuits From Behavioral Descriptions, IEEE Transactions On Computer–Aided Design, pp. 171–180, Feb. 1989.*

D. Gajski et al., High–Level Synthesis, Introduction to Chip and System Design, 1992, Kluwer Academic Publishers.*

W. Glunz et al., VHDL for High–Level Synthesis of Digital Systems, 1st European Conference on VHDL Models, pp. 1–11, Sep. 1990.*

S. Bakshi et al., Component Selection for High–Performance Pipelines, IEEE Transactions on Very Large Integration (VLSI) Systems, vol. 4, No. 2, pp. 181–194, Jun. 1996.*

D. Wong et al., Designing High–Performance Digital Cirucits Using Wave Pipelining: Algorithms and Practical Experiences, IEE Transactions on Computer Aided Design of Integrated Circuits and Systems, vol. 12, No. 1, pp. 25–46, Jan. 1993.*

Alexander Aiken et al. "Optimal Loop Parallelization," Proceedings of the SIGPLAN '88 Conference on Programming Language Design and Implementation, Atlanta, GA, Jun. 1988, pp. 308–317.*

Raul Camposano, "Design Process Model in the Yorktown Silicon Compiler," Proceedings of the 25th ACM/IEEE Design Automation Conference, 1988, pp. 489–494.*

Brian Ebert et al. "SeeSaw: A Verilog Synthesis Viewer," 2nd Annual International Verilog HDL Conference. Design Excellence for Today and Tomorrow; Santa Clara, CA. Mar. 2, 1993, pp. 55–60.*

Phillip B. Gibbons et al., "Efficient Instruction Scheduling for a Pipelined Architecture," 1986. pp. 11–16.*

Brent Gregory et al., "ISIS: A System for Performance Driven Resource Sharing." Proceedings of the 29th ACM/IEEE Design Automation Conference, Jun. 1992, pp. 285–290.*

Seongsoo Hong et al., "Compiling Real–Time Programs into Schedulable Code," ACM/SIGPLAN, Jun. 1993, pp. 166–176.*

Michael C. McFarland et al., "The High–Level Synthesis of Digital Systems," Proceedings of the IEEE, vol. 78, No. 2, Feb. 1990, pp. 301–318.*

Monica Lam, "Software Pipelining: An Effective Scheduling Technique for VLIW Machines," Proceedings of the SIGPLAN '88 Conference on Programming Language Design and Implementation Altanta, GA, Jun. 1988, pp. 318–328.*

MonicaSin–Ling Lam, "A Systolic Array Optimizing Compiler," May 1987, pp. 1–138.*

Nohbyung Park et al., "SEHWA: A Program for Synthesis of Pipelines," 23rd Design Automation Conference/IEEE, 1986, pp. 454–460.*

B. R. Rau et al., "Register Allocation for Software Pipelined Loops," ACM SIGPLAN, 1992, pp. 283–299.*

Leon Stok, "False Loops through Resource Sharing," IEEE, 1992, pp. 345–348.*

"Optimal Loop Parallelization" Alexander Aiken, 1988 ACM, pp. 308–317.*

* cited by examiner

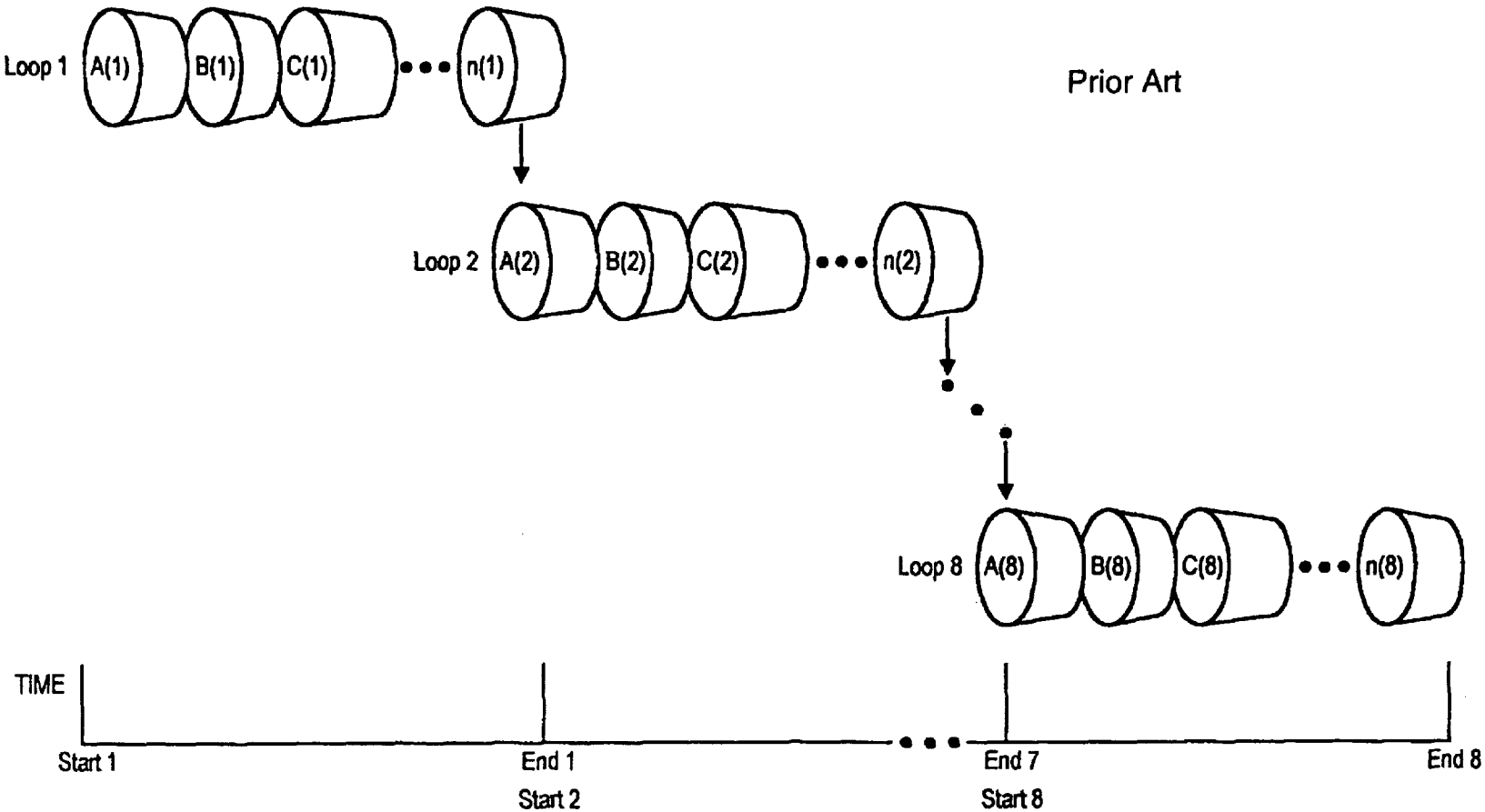
Figure 1 Amended

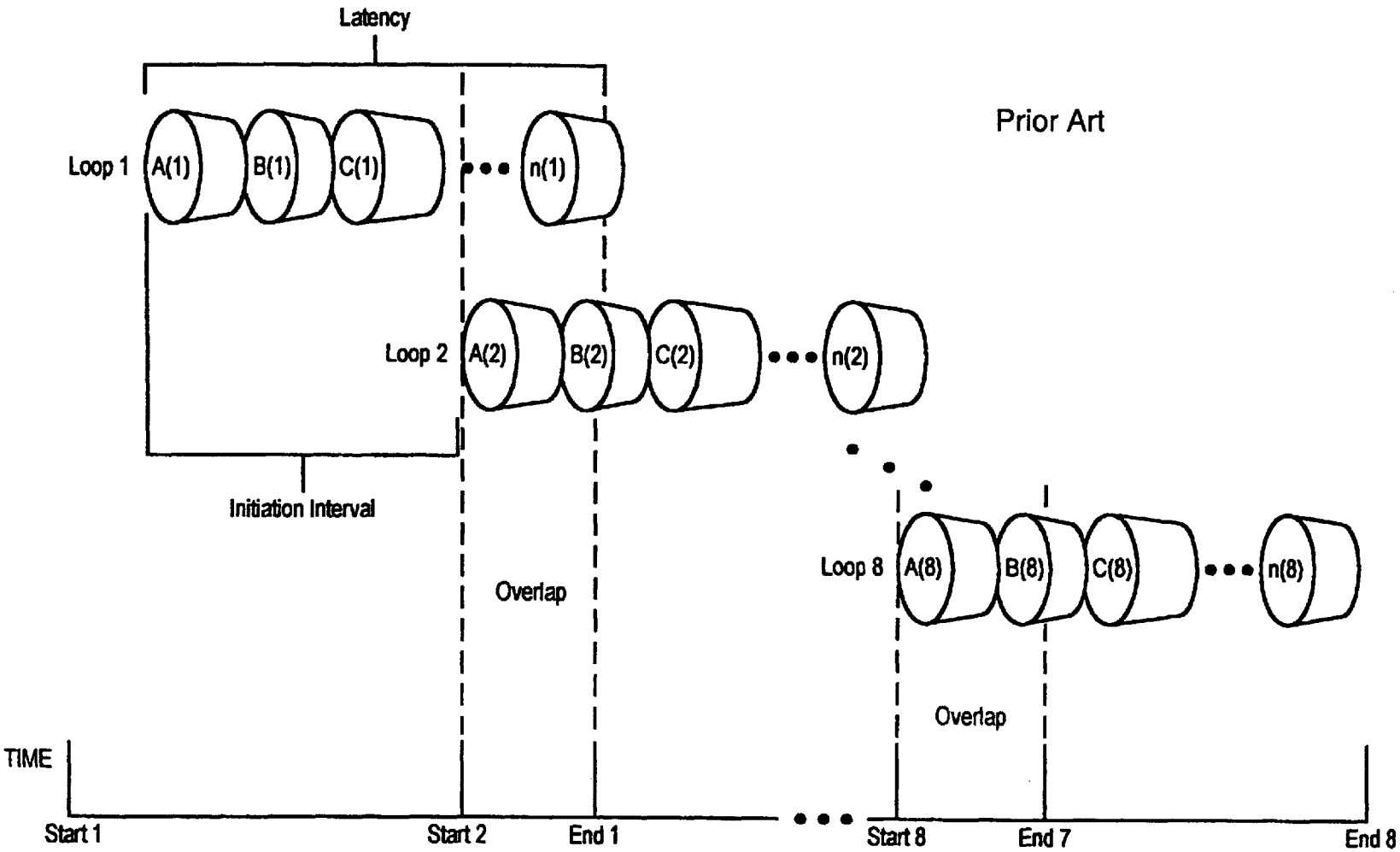
Figure 2 Amended

Prior Art
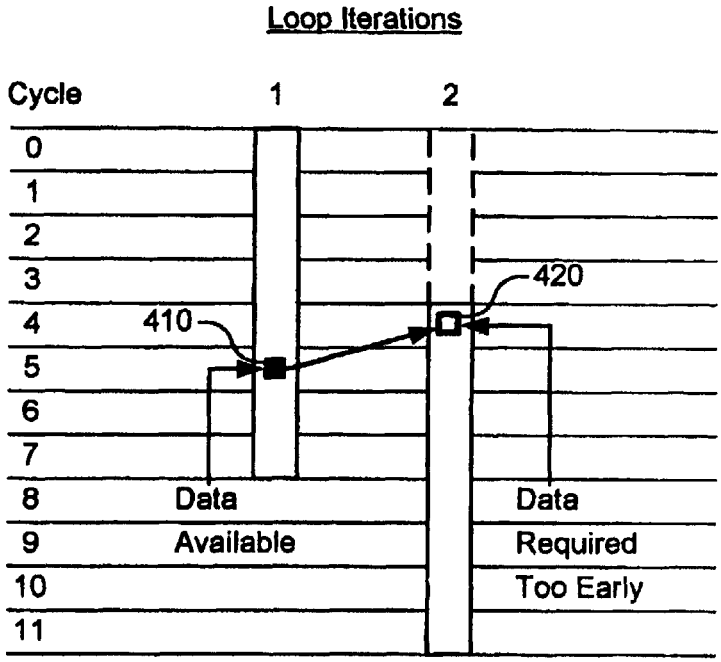
Figure 3 (a) Amended
Prior Art
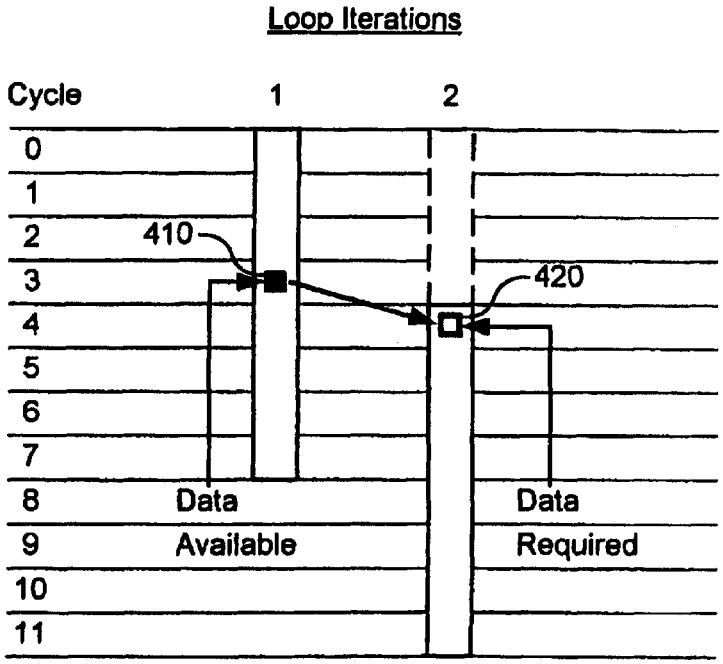
Figure 3 (b) Amended Prior Art
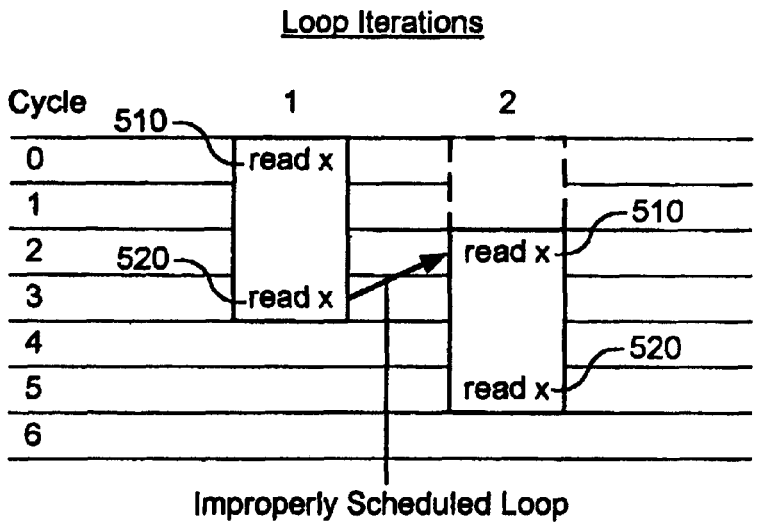
Figure 4 (a) Amended
Prior Art
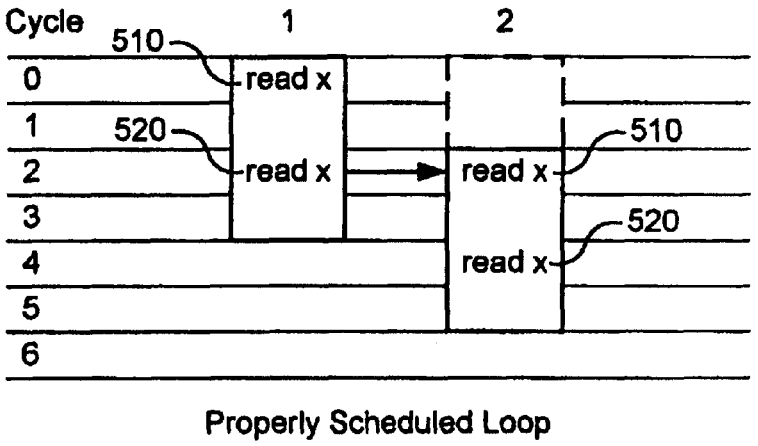
Figure 4 (b) Amended

Figure 6 Synthesis with Scheduling

Scheduling Preprocessing

Scheduling Using Templates

```
module loopex8 ( c, x, y, z, clock);
input [1:0] x, y, z;
    input clock ;
    output [2:0] c;
    reg [2:0] c;
    reg [2:0] p;

    always begin                                  3030

        forever begin : theloop                   3010

            c <= x - p ;

            @(posedge clock) ;                    3020

            p = y + z ;

            @(posedge clock) ;

        end

    end

endmodule
```

Figure 11

```
module write4 ( w, x, clock);

    input [15:0] x ;
    input clock ;
    output [31:0] w;
    reg [32:0] w;
    reg [15:0] x1;
    reg [15:0] x2;

    always begin                                  1530

        forever begin : writeloop                 1530

            x1 <= x ;

            @(posedge clock) ;                    1530

            x2 <= x ;

            w <= x1 * x2 ;

        end

    end

endmodule
```

Figure 15

```
module after1 ( c, x, y, z, clock);

    input [1:0] x, y, z;
    input clock ;
    output [2:0] c;
    reg [2:0] c;
    reg [2:0] p;

    always begin

        @(posedge clock) ;

        forever begin
            c <= #24 x - p ;

            @(posedge clock) ;

            p = y + z ;

            @(posedge clock) ;
        end
    end
endmodule
```

Figure 19 (a)

```
entity after1 is
    port(
            c : out integer range 0 to 7;
            x, y, z : in integer range 0 to 3;
            clock : in bit
    );
end after1;

architecture behavioral of after1 is begin
    process
            variable p : integer range 0 to 7;
    begin
            wait until clock'event and clock = '1';

            loop

                c <= transport x - p after 24 ns;

                wait until clock'event and clock = '1';

                p := y + z;

                wait until clock'event and clock = '1';

            end loop;

   end process;
end behavioral;
```

Figure 19 (b)

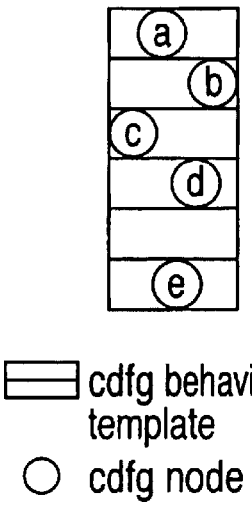
FIG. 29a
New
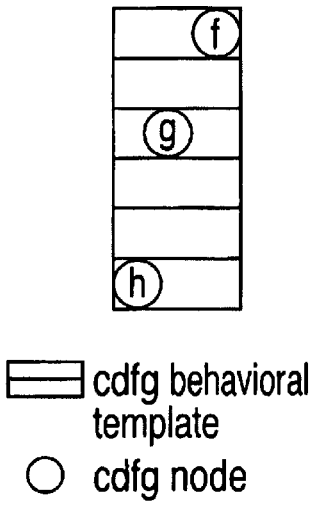
FIG. 29b
New
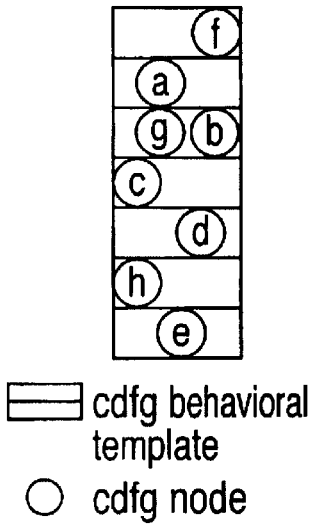
FIG. 29c
New
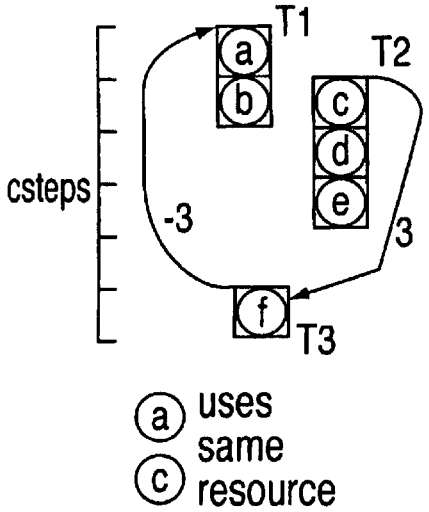
FIG. 30a
New
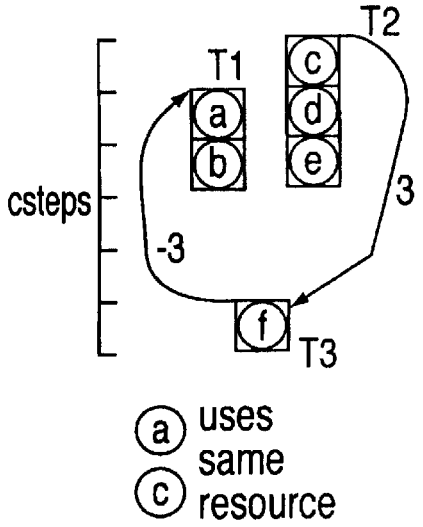
FIG. 30b
New

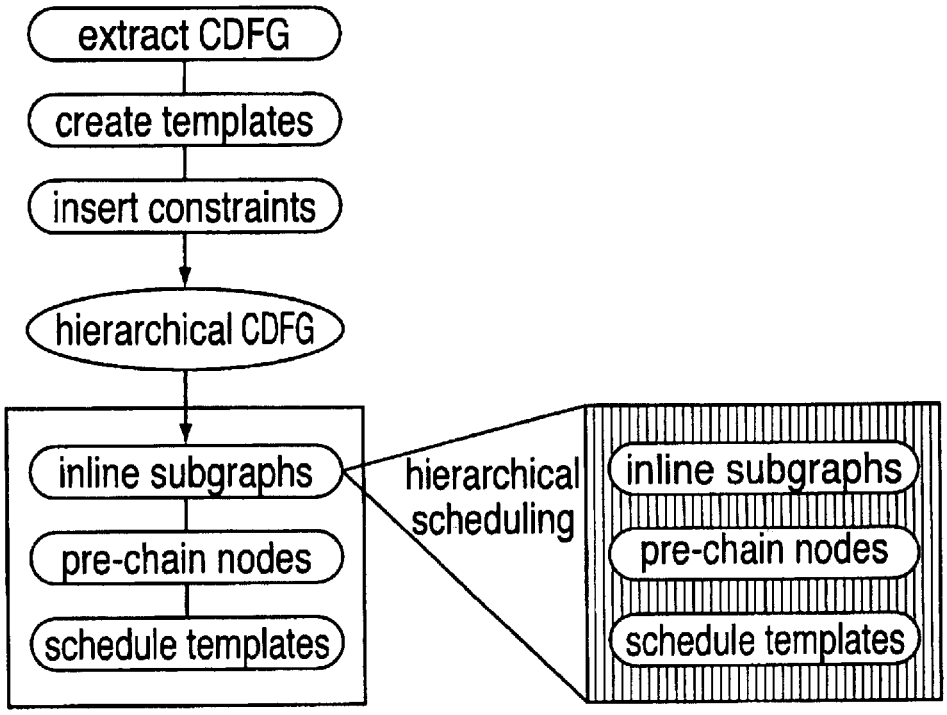
FIG. 31
New
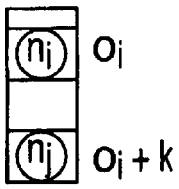
FIG. 32a
New
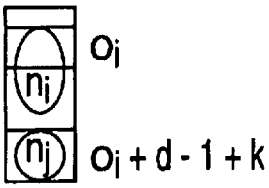
FIG. 32b
New
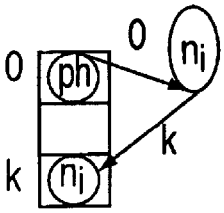
FIG. 32c
New

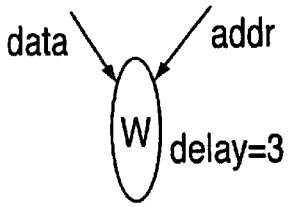
FIG. 33a
New
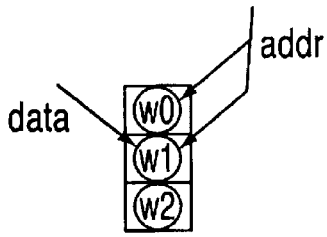
FIG. 33b
New
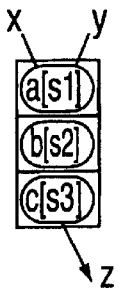
FIG. 34a
New
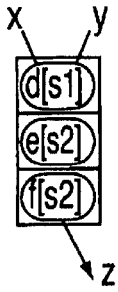
FIG. 34b
New
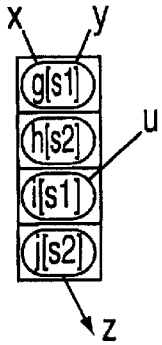
FIG. 34c
New
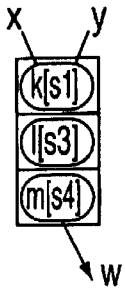
FIG. 34d
New

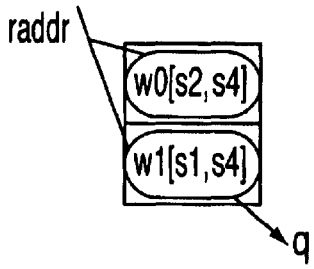
FIG. 35a New
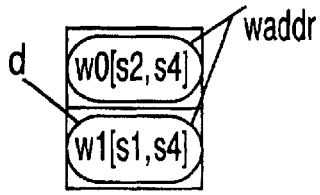
FIG. 35b New
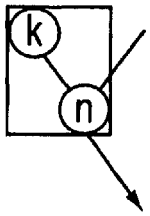
(k) constant
(ze) zero-extend
(bx) bit-extract
(u1)(u2) logic operations
FIG. 36a New
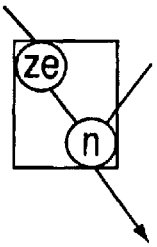
(k) constant
(ze) zero-extend
(bx) bit-extract
(u1)(u2) logic operations
FIG. 36b New
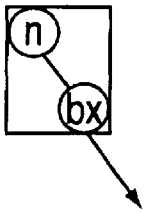
(k) constant
(ze) zero-extend
(bx) bit-extract
(u1)(u2) logic operations
FIG. 36c New
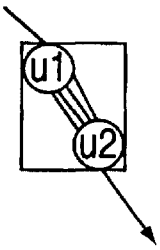
(k) constant
(ze) zero-extend
(bx) bit-extract
(u1)(u2) logic operations
FIG. 36d New

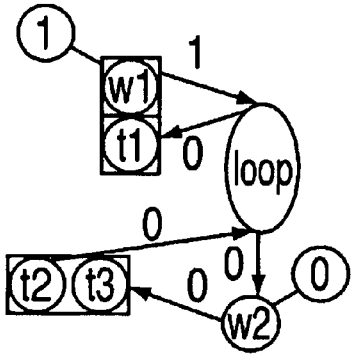
FIG. 37a
New
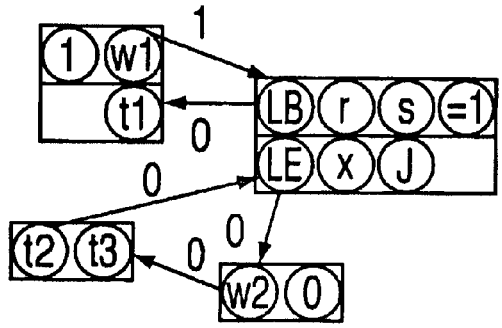
FIG. 37b
New

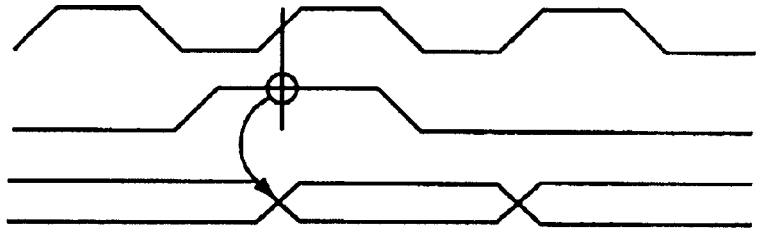
FIG. 38
New
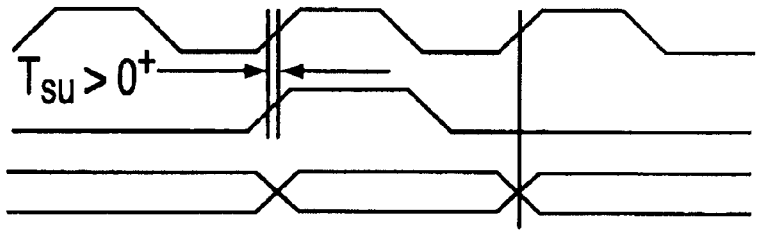
FIG. 39a
New
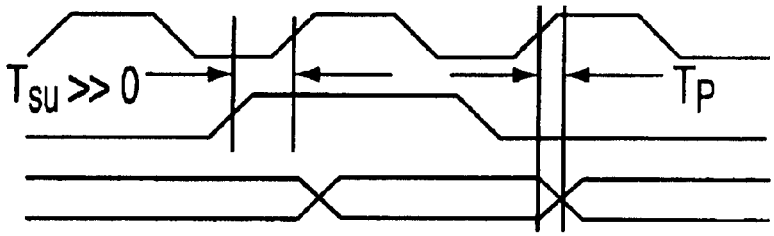
FIG. 39b
New

```
o1 <= v1;
while (c) begin: loop
    o2 <= v2;
    @(posedge clock);
end
o3 <= v3;
@(posedge clock);
```

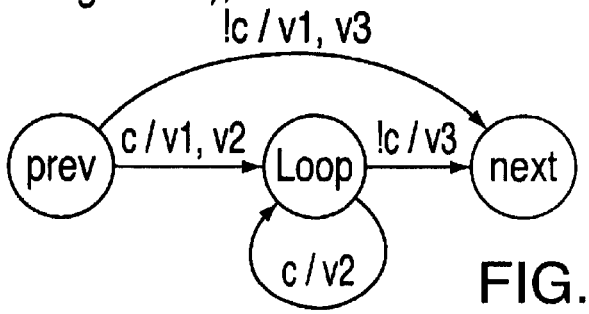

FIG. 40 New

```
o1 <= v1;
while (c) begin: loop
    @(posedge clock);
    o2 <= v2;
end
@(posedge clock);
o3 <= v3;
```

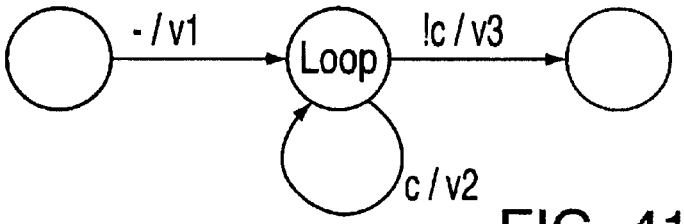

FIG. 41 New

```
@(posedge clock);
if (input_signal= 1'b1)begin
        x= input_read_1;
        y=input _read_2;
        tmp = x+ y;//2 cycle addition
        @(posedge clock);//strobe stab regs
        @(posedge clock);//1st cycle of add
        @(posedge clock);//2nd cycle of add
        out<=tmp;
end
@(posedge clock);
```

FIG. 42 New

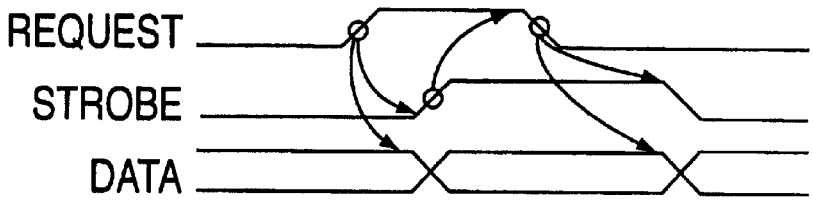
FIG. 43 New
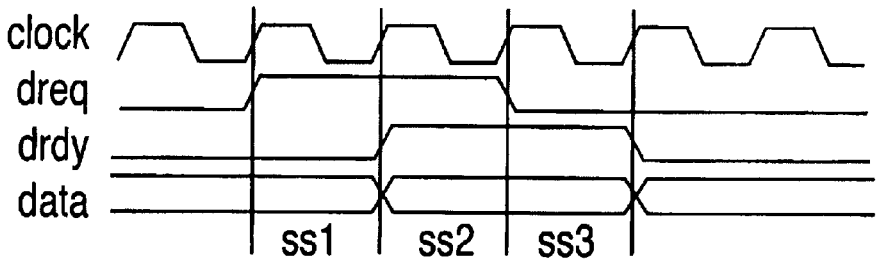
FIG. 44a New
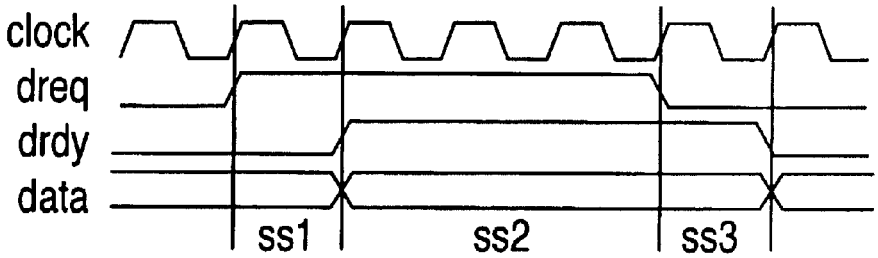
FIG. 44b New
```
a1=in_port1;
a2=in_port2;
@(posedge clock);
out_port_1<=long_function_1(a1,a2);
@(posedge clock);
b1=in_port3;
b2=in_port4;
@(posedge clock);
out_port_2<=long_function_2(b1,b2);
```
FIG. 45 New

METHODS FOR AUTOMATICALLY PIPELINING LOOPS

Matter enclosed in heavy brackets [ ] appears in the original patent but forms no part of this reissue specification; matter printed in italics indicates the additions made by reissue.

RELATED APPLICATIONS

This application is related to U.S. patent application Ser. No. 08/440,101 entitled "Behavioral Synthesis Links to Logic Synthesis" with inventors Ronald A. Miller, Donald B. MacMillen, Tai A. Ly and David W. Knapp filed on May 12, 1995, which is hereby incorporated by reference.

*U.S. patent application Ser. No. 08/440,101 has issued as U.S. Pat. No. 6,026,219 and 6,505,339, entitled "Behavioral Synthesis Links to Logic synthesis," with inventors Ronald A. Miller, Donald B. MacMillen, Tia A. Ly and David W. Knapp, with issue dates, respectively, of Feb. 15, 2000 and Jan. 7, 2003.*

BACKGROUND

Field of the Invention

This invention relates to the field of computer aided design for digital circuits, particularly to automatically pipelining loops in a behavioral synthesis system.

Statement of the Related Art

Behavioral Synthesis

Behavioral vs. Register Transfer Level Design

Many of toady's integrated circuits are described using a Hardware Description Language (HDL). Two common HDL's are VHDL and Verilog. VHDL is described in the IEEE Standard VHDL Language Reference Manual available from the Institute of Electrical and Electronic Engineers in Piscataway, New Jersey which is hereby incorporated by reference. Verilog is described in The Verilog Hardware Description Language by Donald E. Thomas and Philip Moorby. Kluwer Academic Publishers. 1991 which is hereby incorporated by reference.

As integrated circuits become increasingly complex, hardware designers are increasingly using synthesis software to transform HDL descriptions of digital circuits into mapped logic. The designer writes a description of a digital circuit in VHDL, Verilog, or another HDL, and uses synthesis software to create a digital circuit from the description. Using synthesis software typically shortens the amount of time required to create a digital circuit from a design specification, and allows a designer to create more complex designs than is possible manually.

Many of today's complex designs are expressed as software descriptions and simulated to verify their correctness. These designs are later translated from software into hardware, in the form of Integrated Circuits (ICs), Application Specific Integrated Circuits (ASICs), or Field Programmable Gate Arrays (FPGAs), for implementation in the final product. This design description methodology is called algorithmic-level design.

Instead of beginning design at the Register Transfer Level (RTL), behavioral synthesis begins at the algorithmic (behavioral) level. RTL level design is described in Computer Structures: Reading and Examples by C. Gorden Bell and Allen Newell. McGraw-Hill 1971. A behavioral hardware description language (HDL) specification contains instructions, operations, variables, and arrays similar to the original software algorithm.

The target architecture of behavioral synthesis is a general computing model that contains datapath, memory, and control elements. Conventional design techniques currently use a manual RTL design methodology to build a datapath. A datapath is a sequence of logic consisting of registers, higher order functional units (such as adders and multipliers), and multiplexers. The datapath in a digital circuit uses the circuit's inputs to compute output results. Registers are 1-bit memory elements which hold their value through each clock cycle.

Conventional design techniques also build a controller at the RTL to sequence and control the actions of the datapath, memory, and Input/Output (I/O). Frequency, such controllers are implemented using a Finite State Machine (FSM). Finite state machines are described in Switching and Finite Automata Theory by Zvi Kohavi, Computer Science Press, 1978 which is hereby incorporated by reference. Controllers may also determine actions such as which branch of a conditional statement is executed.

Behavioral synthesis builds this architecture by using automated methods of scheduling, allocation, register sharing, memory and control inferencing—all of which are performed manually in an RTL methodology. The designer is freed from having to specify the exact architecture of a design and can automatically explore many implementations to find the optimal architecture.

Components of Behavioral Synthesis

The High-Level Synthesis of Digital Systems by Michael McFarland, Alice Parker, and Raul Camposano, in Proceedings of the IEEE, February 1990, which is hereby incorporated by reference, provides an excellent overview of High Level Synthesis, as Behavioral Synthesis is often called.

Three components of a behavioral synthesis system are Scheduling, Allocation, and Resource Sharing.

Scheduling determines in which clock cycle each operation executes. Scheduling extracts the control and data flow operations of a design specification and assigns these operations to cycles. A state machine controller is synthesized to sequence the operations and execute them in their assigned cycle. The typical goal of this process is to assign operations to cycles so as to be able to implement the design with the fewest resources (registers, multiplexers, and operations) while at the same time minimizing the number of clock cycles (latency).

Allocation is a behavioral synthesis task that maps the operations and data of a behavioral HDL specification into the datapath, which contains memories, registers, functional units such as adders and multiplexers, and gates. Allocation determines which type of operation to use for each operator. For instance, if an operator performs addition, a ripple carry, a carry-lookahead, or some other type of adder can be used.

Resource Sharing attempts to share hardware resources between operators in a design. For example, consider two additions which occur in mutually exclusive conditional branches. Such additions will never be performed at the same time. Thus, they can be performed on the same piece of hardware. Resource sharing attempts to minimize the amount of hardware used by sharing hardware as much as possible.

Scheduling Modes

There are several modes for automatically scheduling operations into control steps. Briefly, these modes are cycle-fixed, superstate-fixed, and free-floating mode. In cycle-fixed mode, all I/O operations are constrained to occur in the same cycle in the original HDL descriptions and in the synthesized design. In cycle-fixed mode, the cycle level behavior of the synthesized circuit must match the cycle level simulation behavior of the source HDL.

The other scheduling modes allow behavioral synthesis a greater degree of freedom in assigning states in a schedule. Scheduling modes are discussed further in Behavioral Synthesis Methodology for HDL-Based Specification and Validation by D. Knapp, T. Ly, D. MacMillen and R. Miller in Proceedings of the 31st DAC, June 1995, which is included as Appendix B and is hereby incorporated by reference. There are also discussed in Behavioral Compiler User Guide Version 3.2a available from Synopsys, Inc. In Mountain View, Calif., which is hereby incorporated by reference.

Loop Pipelining

In behavioral HDL, a loop repeatedly executes the operations in the loop body until an exit condition becomes true. Loop iterations are usually sequential; operations in the first iteration are executed, operators in the next iteration are executed, and so on, as shown in FIG. 1. The throughput, that is the amount of data processed per unit time, of the function implemented by the loop body is limited by the critical path in the loop body.

In some loops, data required by an operation in the next loop iteration is available prior to completion of the current loop. Under these conditions, the designer can pipeline the loop—parallelizing execution of iterations to increase throughput beyond critical path limitations of the loop body. This process of loop pipelining schedules consecutive loop iterations to partially overlap in time; a new loop iteration is initiated before the current iteration has finished.

FIG. 2 shows an example of loop pipelining where the data required by operation A in iteration two is available after operation C in the first loop iteration.

The two timing-related aspects of a loop that affect throughput are:

Initiation interval: The number of clock cycles between the start of two consecutive loop iterations.

Latency: The number of clock cycles required to execute all operations in a single loop iteration.

For sequential loops that are not pipelined, the initiation interval and latency of a loop are the same. For a pipelined loop, the initiation interval is smaller than the latency.

The primary reason for using loop pipelining is to increase the throughput of the design; the trade-off is that the design area usually increases.

Many designs have separate specifications on throughput and input-to-output delay. The throughput specification constrains the initiation interval. The input-to-output delay specification constrains the loop latency. Loop pipelining enables a flexible relationship between the initiation interval and latency of a loop.

An example of a candidate for loop pipelining is a design that processes a data stream. This type of design often has tight throughput requirements based on the rate of the data streams and loose input-to-output delay constraints.

Loop Carry Dependencies

Loop Carry Dependencies (LCDs) are data values produced in one iteration of a loop and consumed by operations in subsequent iterations.

In loop pipelining, loop iterations that are producers and consumers of LCDs can happen at the same time. To preserve data dependencies, the operations in a loop must be scheduled so that LCD values are available in time for the iteration in which they will be consumed. Two schedules for a LCD are shown in FIG. 3.

The example of FIG. 3(a) violates the LCD. Operation 410 is scheduled so that its output is not ready in time for operation 420 to use it in the next iteration of the loop. The example of FIG. 3(b) is scheduled correctly. In this case, operation 410 is scheduled so that its output is ready in time for operation 420 to execute in the next iteration of the loop.

Memory and I/O Accesses

Loop Pipelining must preserve the original ordering of all reads and writes to the same memory, signal, or port. In addition, the ordering reads and writes in one iteration of the loop may not "cross," or occur after, reads and writes in subsequent iterations of the loop. Specifically, all reads and writes to the same memory, and all writes to the same signal or port in one iteration of the loop must occur before any reads or writes to the same memory, signal or port in a subsequent iteration of the loop. All reads of the same signal or port must occur simultaneously to or before any read of the same signal or port in a subsequent iteration of the loop.

For example, FIG. 4 shows two schedules for a loop that has two reads of signal x. In FIG. 4(a), read 510 and read 520 are improperly scheduled. Read 520 occurs after read 510 occurs in the next iteration of the loop. In FIG. 4(b), read 510 and read 520 are properly scheduled. In this schedule, read 520 occurs after read 510 in the next iteration of the loop.

A BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 1 shows an example of sequential loop processing.

FIG. 2 shows an example of pipelined loop processing including the loop latency and initiation interval.

FIG. 3 shows an example of a loop carry dependency.

FIG. 4 shows an example of memory and I/O access restrictions in pipelined loops.

FIG. 11 shows HDL source code which contains a loop with a producer and a consumer.

FIG. 15 shows Verilog HDL source code which contains a loop with I/O dependencies.

FIG. 19 (a) and FIG. 19 (b) are examples of HDL source code including a delay clause.

Figure 20:
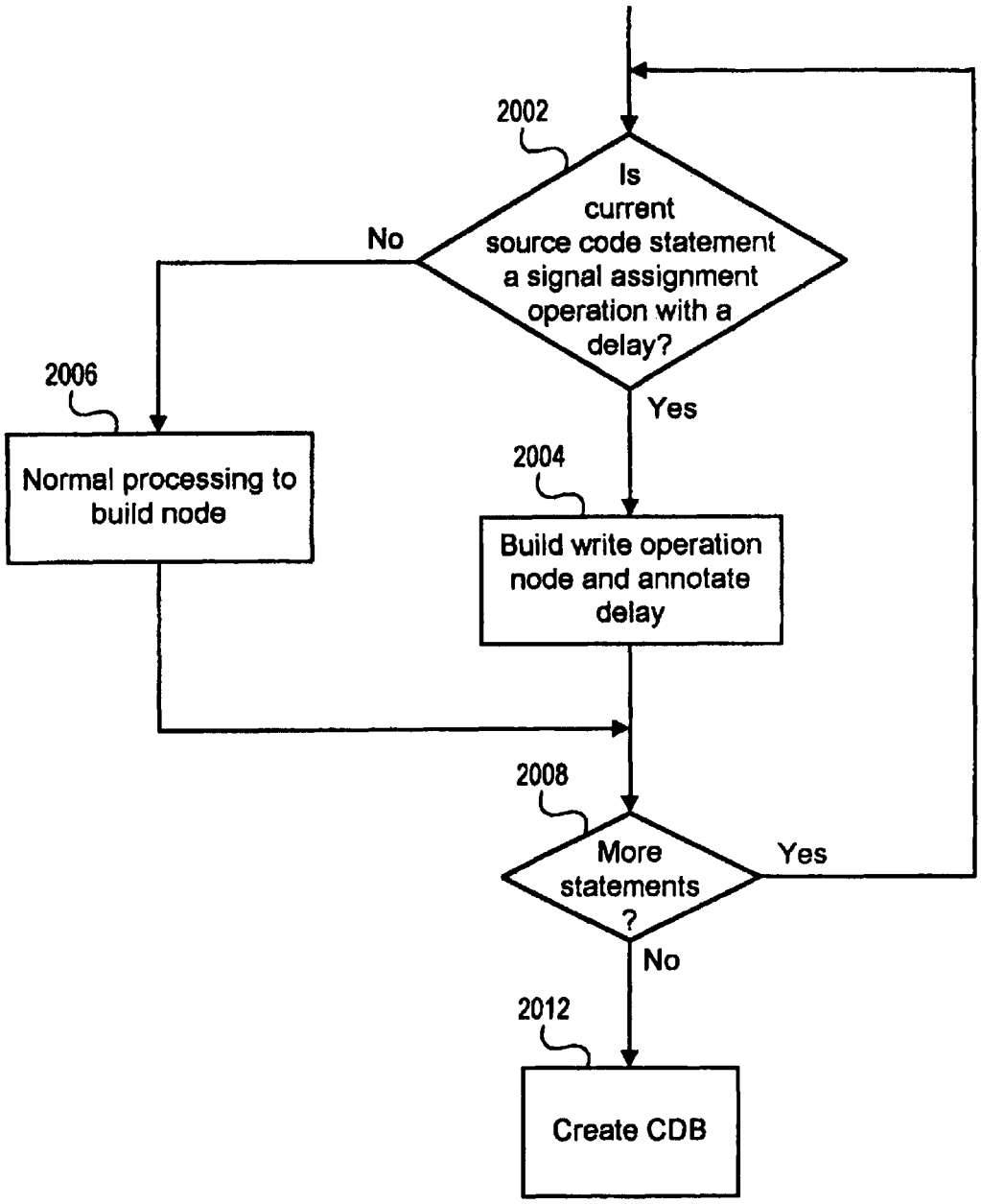

FIG. 20 is a flowchart showing steps performed during translation from the source code of FIG. 19 (a) and FIG. 19 (b) to a circuit design that incorporates a delay specified by the delay clause.

Figure 21:
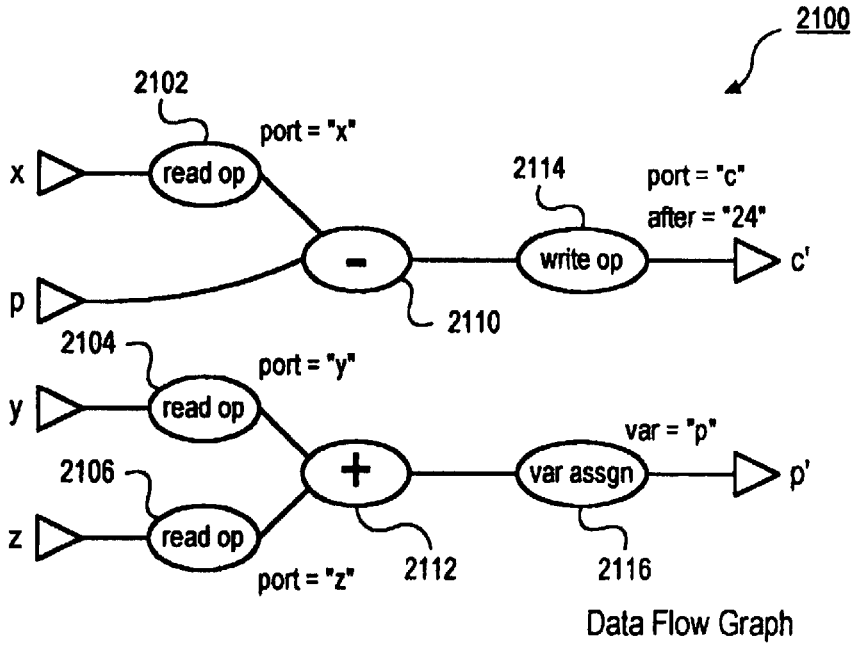

FIG. 21 is a representation of a data flow graph generated from the source code of FIG. 19 (a) and (b) in accordance with the steps of FIG. 20.

Figure 22:
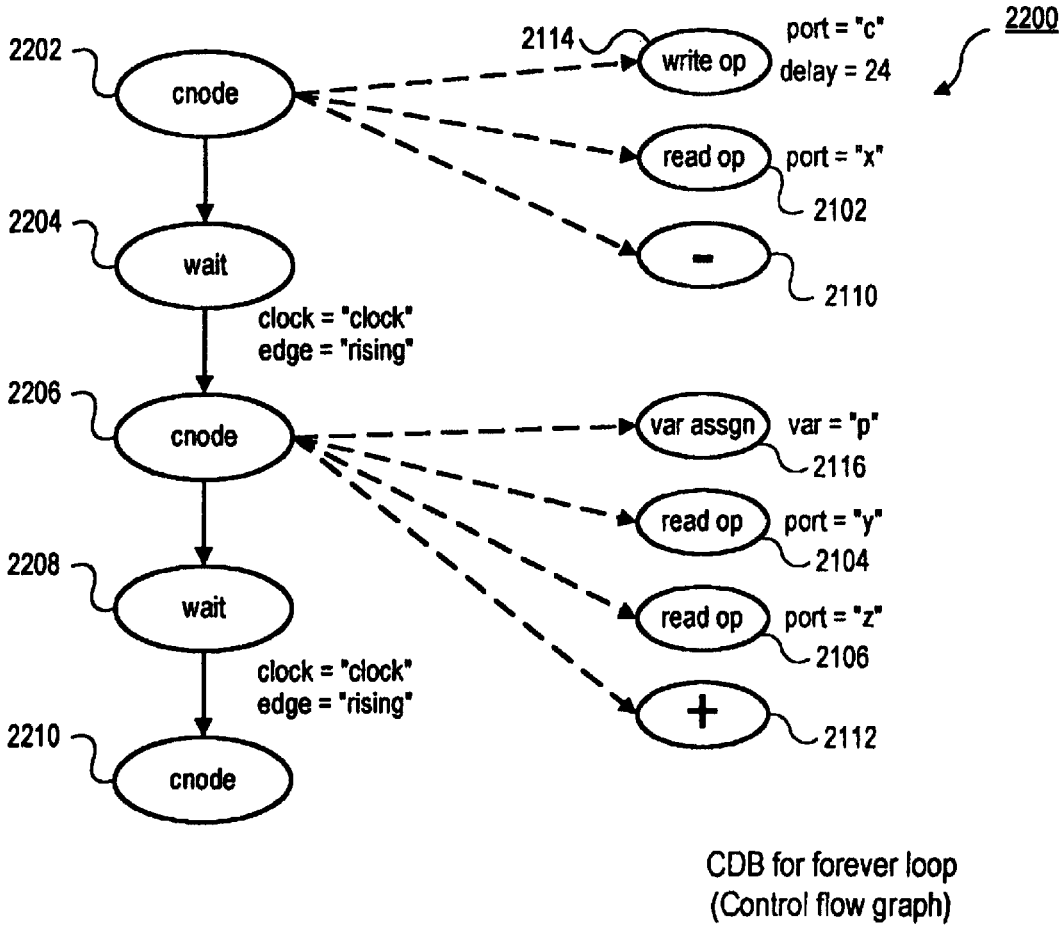

FIG. 22 is a representation of a control flow graph generated from the source code of FIG. 19 (a) and (b) and the data flow graph of FIG. 21.

Figure 23:
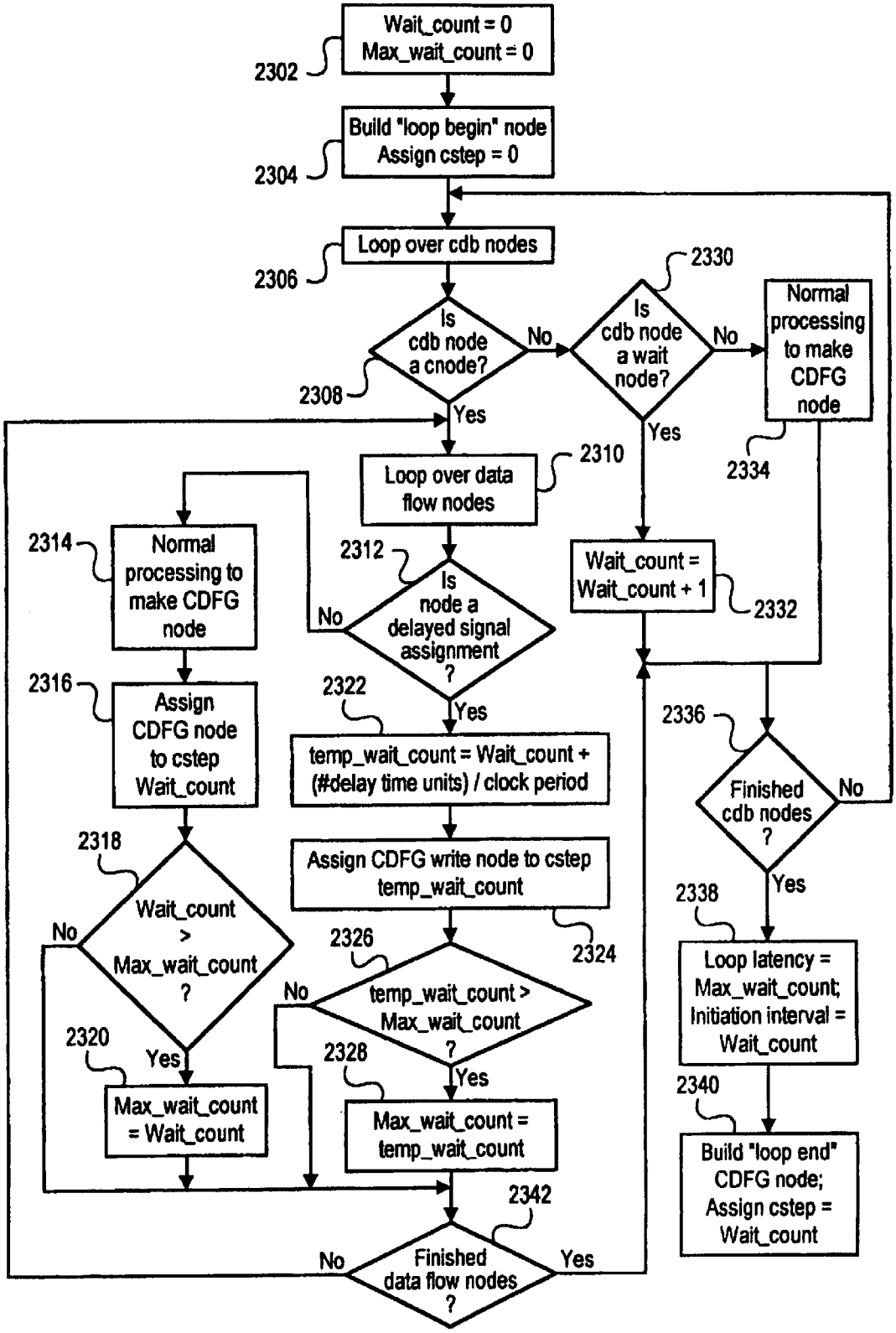

FIG. 23 is a flow chart showing steps performed to generate a control data flow graph from the control flow graph and data flow graph of FIG. 21 and FIG. 22.

Figure 24:
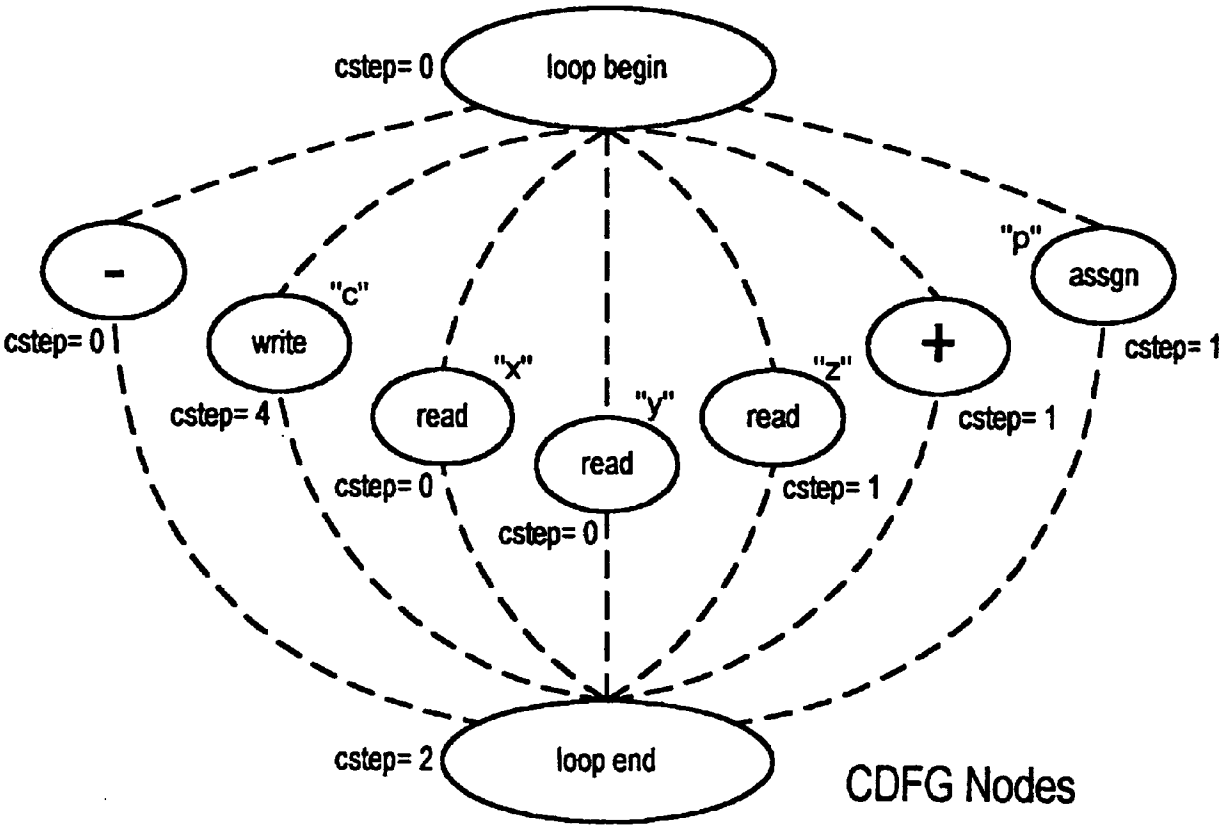

FIG. 24 is a representation of a control data flow graph generated by the steps of FIG. 23.

Figure 25:
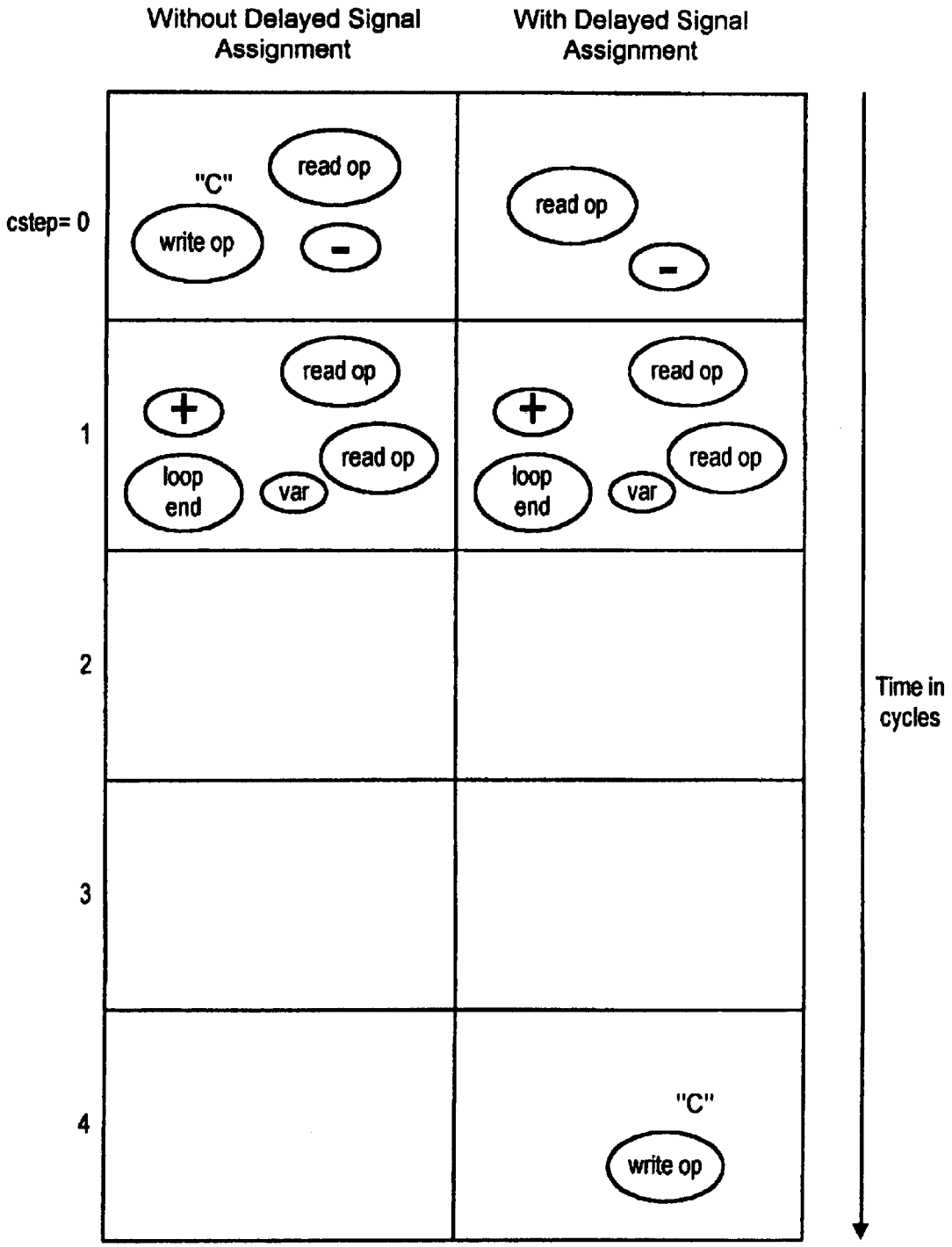

FIG. 25 is a diagram showing an example of loop tiling with and without the delay in the HDL.

Figure 26:
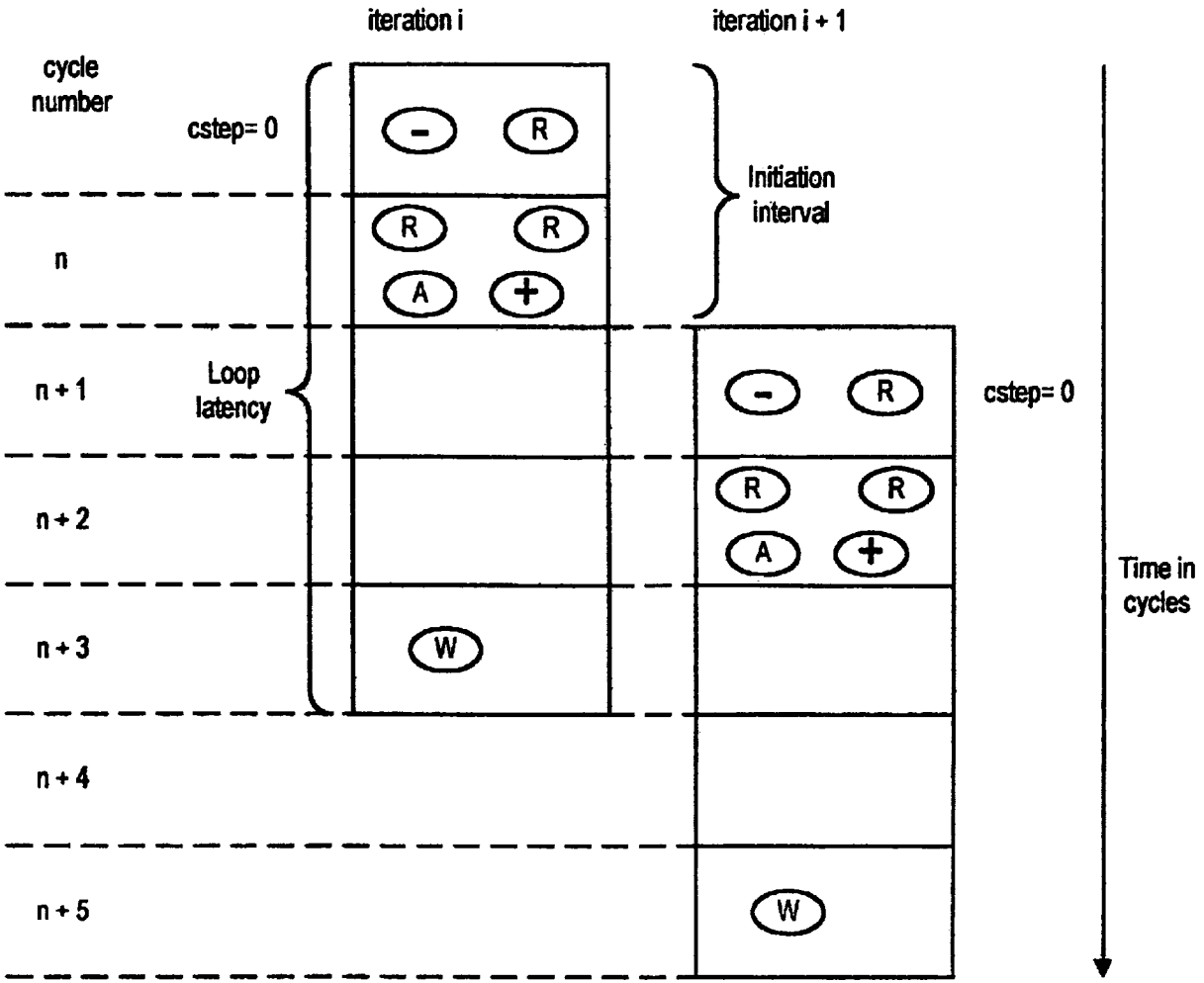

FIG. 26 is a diagram showing the effect of the delay clause on pipelining.

Figure 12:
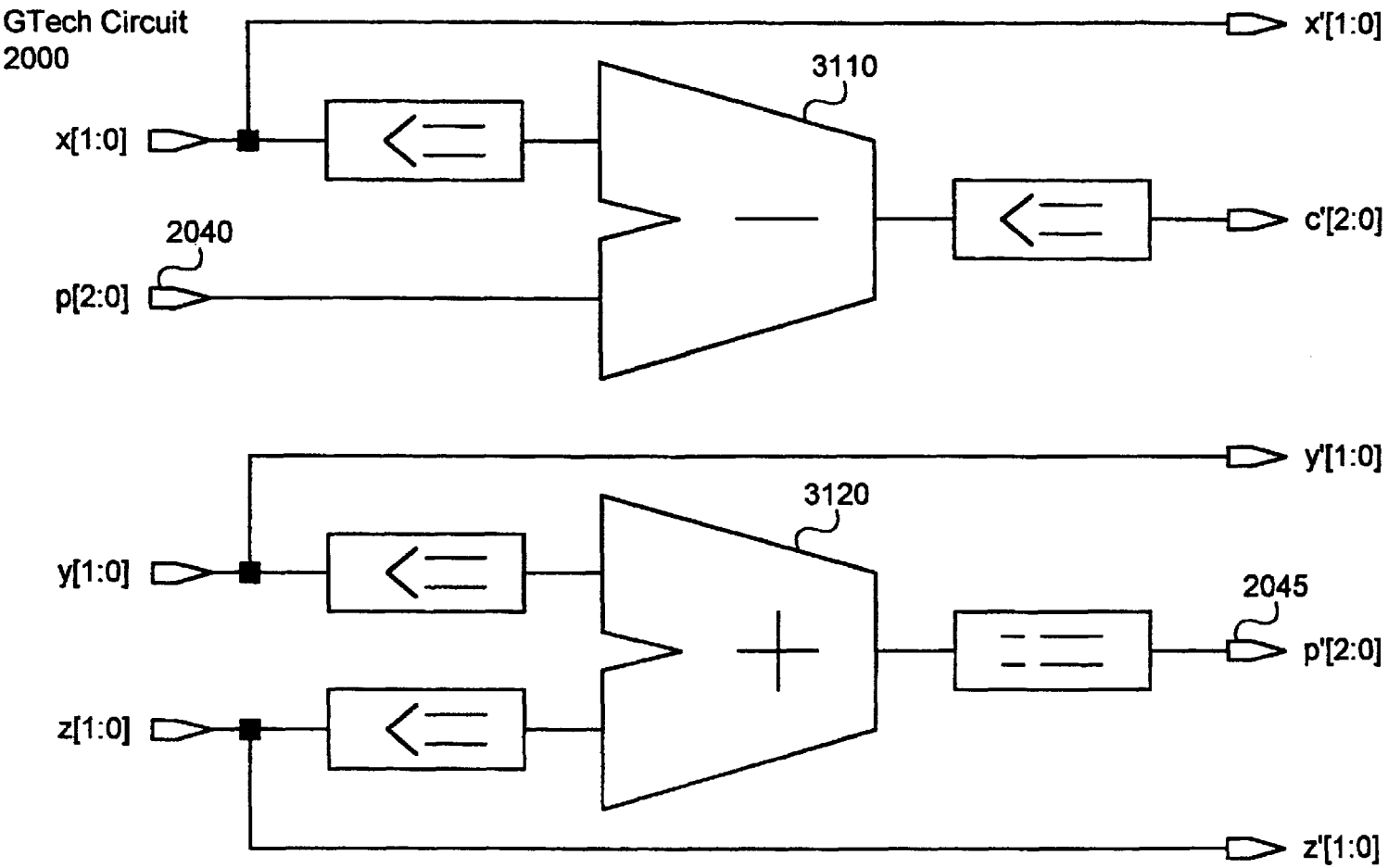
FIG. 12 shows a circuit before scheduling which is created from loop 3030 of FIG. 11.
Figure 27:
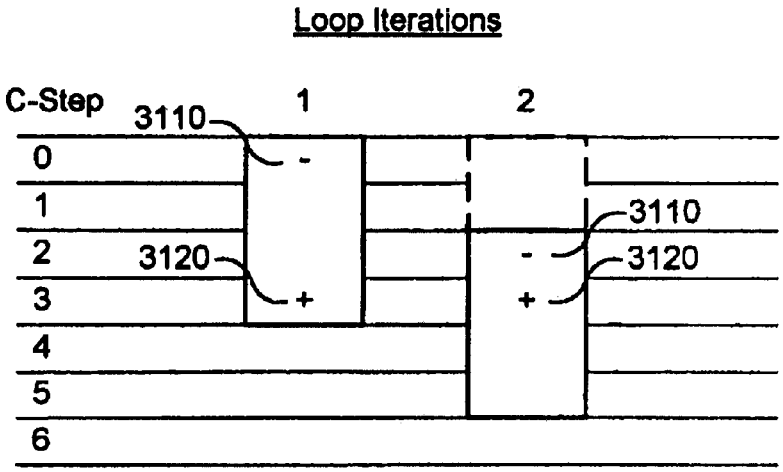

FIG. 27 shows the operations of FIG. 12 scheduled into control steps.

Figure 16:
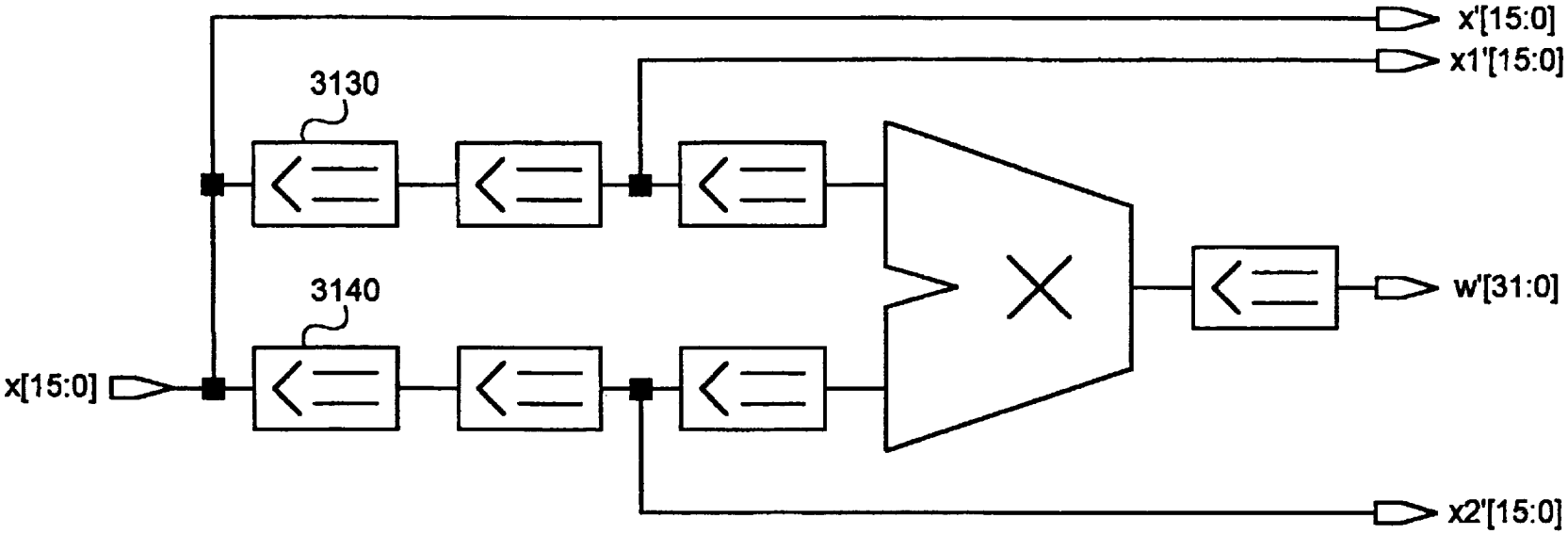
FIG. 16 shows a circuit before scheduling which is created from loop 1530 of FIG. 15.
Figure 28:
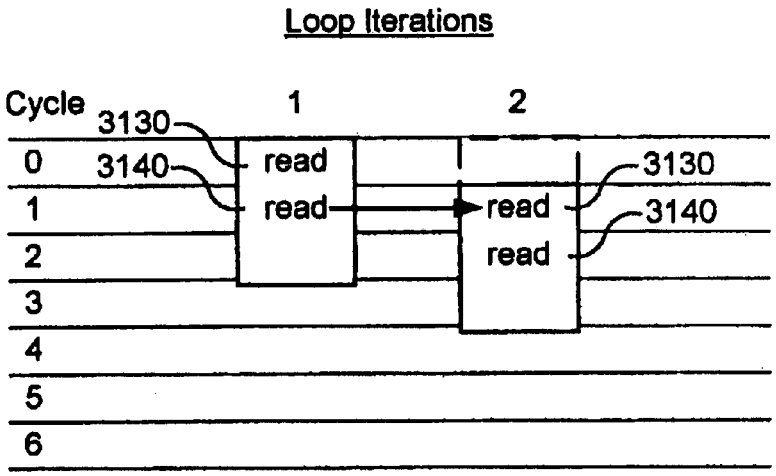

FIG. 28 shows the read operations of FIG. 16 scheduled into control steps.

*FIG. 29 depicts template examples: (a) T1={(a, 0) (b,1) (c,2) (d,3) (e,5)}, (b) T2={(f,0) (h,5)}; (c) T3={(f,0) (a, 1) (g,2) (b,2) (c,3) (d,4) (h,5) (e,6)}.*

*FIG. 30 depicts an example of list scheduling failure and recovery (a) first iteration falls at T2 (b) second iteration succeeds with T1 relaxed to cstep 1.*

*FIG. 31 shows overall flow for hierarchical scheduling.*

*FIG. 32 shows timing constraints (a) $n_j$ starts k cycles after $n_i$ starts, (b) $n_j$ starts k cycles after $n_i$ ends and $n_i$ has static delay d, (c) $n_j$ sarts k cycles after $n_i$ ends and $n_i$'s delay in not static.*

*FIG. 33 shos models for a 3-cycle RAM write operation: (a) single node with delay=3; (b) 3 nodes locked in a template.*

*FIG. 34 shows template models for: (a) basic 3-stage pipelined operation, (b) 3-cycle pipelined operation with 2 stages and internal feedback, (c) 4-cycle pipelined operation with 2 stages and sequential inputs, (d) pipelined operation using a different internal path and output port.*

*FIG. 35 shows Template Models for RAM (a) 2-cycle read, and (b) 2-cycle write.*

*FIG. 36 shows pre-chaining examples: (a) constant with successor; (b) zero-extension with successor, (c) bit-extract with predecessor, (d) multi-input logic with predecessor or multi-output logic with successor.*

*FIG. 37 shows handshaking for start signal: (a) original CDFG with timing constraints, (b) final CDFG scheduled.*

*FIG. 38 shows response to an external event.*

*FIG. 39 shows comparison of simulation in cycle-fixed mode, where FIG. 39a shows simulation of specified design (pre-synthesis) and FIG. 39b shows simulation of synthesized design (post-synthesis).*

*FIG. 40 shows loop and corresponding state graph.*

*FIG. 41 shows loop that does not need partial unrolling.*

*FIG. 42 shows HDL description for a multicycle addition.*

*FIG. 43 shows two-wire handshaking protocol.*

*FIG. 44a shows simulation before superstate-fixed scheduling; FIG. 44b shows simulation after superstate-fixed scheduling.*

*FIG. 45 shows writes to out port 1 and out port 2 may be permuted.*

DETAILED DETAILED DESCRIPTION OF THE INVENTION

The present invention is a method and apparatus for synthesizing a circuit which implements a pipelined loop from a Hardware Description Language (HDL) description. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

1.0 Computer System Description

Figure 5:
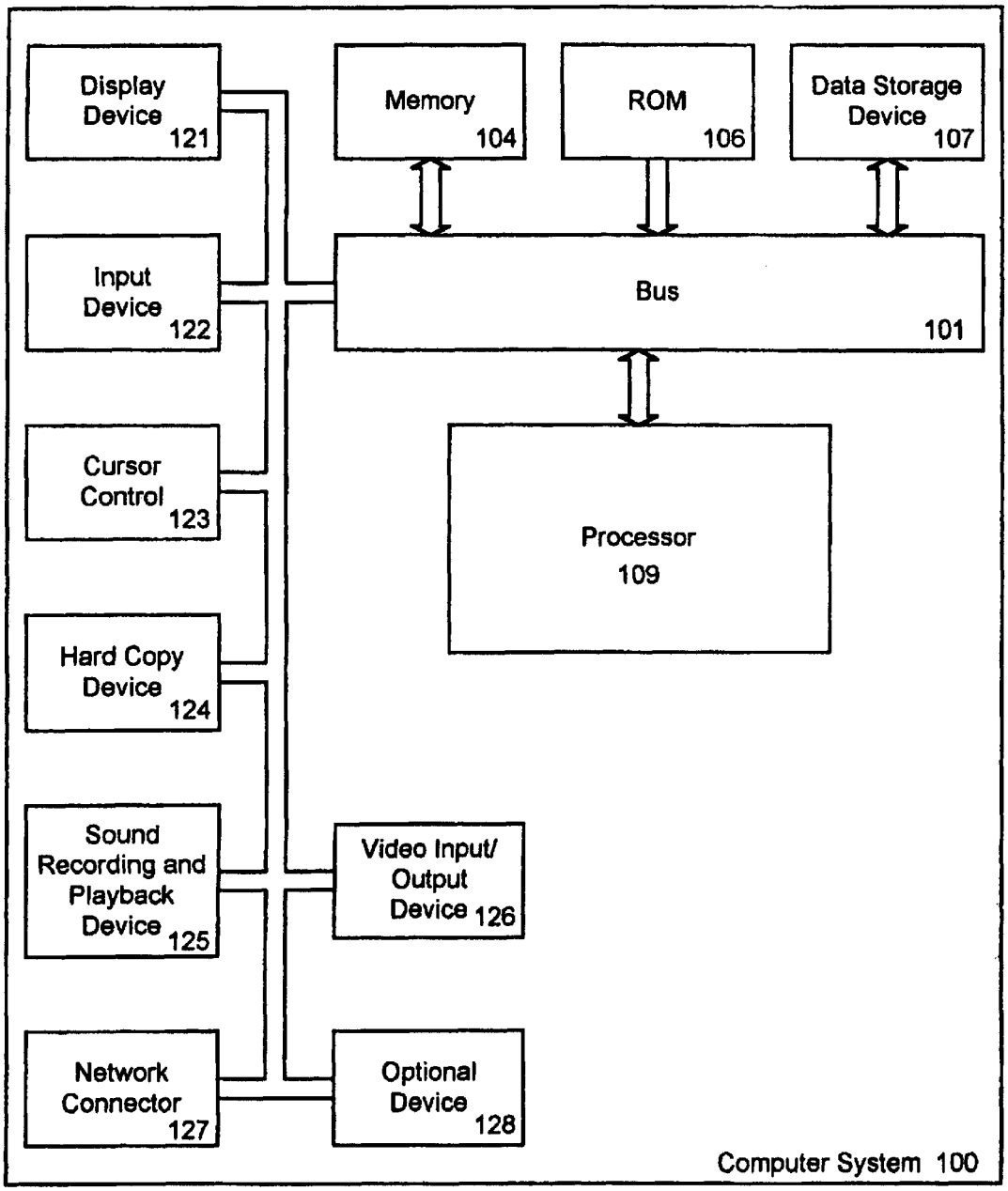
FIG. 5 is a block diagram showing a computer system.

FIG. 5 illustrates a computer system 100 in accordance with a preferred embodiment of the present invention. The computer system 100 includes a bus 101, or other communications hardware and software, for communicating information, and a processor 109, coupled with the bus 101, is for processing information. The processor 109 can be a single processor or a number of individual processors that can work together. The computer system 100 further includes a memory 104. The memory 104 can be random access memory (RAM), or some other dynamic storage device. The memory 104 is coupled to the bus 101 and is for storing information and instructions to be executed by the processor 109. The memory 104 also may be used for storing temporary variables or other intermediate information during the execution of instructions by the processor 109. The computer system 100 also includes a ROM 106 (read only memory), and/or some other static storage device, coupled to the bus 101. The ROM 106 is for storing static information such as instructions or data.

The computer system 100 can optionally include a data storage device 107, such as a magnetic disk, a digital tape system, or an optical disk and a corresponding disk drive. The data storage device 107 can be coupled to the bus 101.

The computer system 100 can also include a display device 121 for displaying information to a user. The display device 121 can be coupled to the bus 101. The display device 121 can include a frame buffer, specialized graphics rendering devices, a cathode ray tube (CRT), and/or a flat panel display. The bus 101 can include a separate bus for use by the display device 121 alone.

An input device 122, including alphanumeric and other keys, is typically coupled to the bus 101 for communicating information, such as command selections, to the processor 109 from a user. Another type of user input device is a cursor control 123, such as a mouse, a trackball, a pen, a touch screen, a touch pad, a digital tablet, or cursor direction keys, for communicating direction information to the processor 109, and for controlling the cursor's movement on the display device 121. The cursor control 123 typically has two degrees of freedom, a first axis (e.g., x) and a second axis (e.g., y), which allows the cursor control 123 to specify positions in a plane. However, the computer system 100 is not limited to input devices with only two degrees of freedom.

Another device which may be optionally coupled to the bus 101 is a hard copy device 124 which may be used for printing instructions, data, or other information, on a medium such as paper, film, slides, or other types of media.

A sound recording and/or playback device 125 can optionally be coupled to the bus 101. For example, the sound recording and/or playback device 125 can include an audio digitizer coupled to a microphone for recording sounds. Further, the sound recording and/or playback device 125 may include speakers which are coupled to digital to analog (D/A) converter and an amplifier for playing back sounds.

A video input/output device 126 can optionally be coupled to the bus 101. The video input/output device 126 can be used to digitize video images from, for example, a television signal, a video cassette recorder, and/or a video camera. The video input/output device 126 can include a scanner for scanning printed images. The video input/output device 126 can generate a video signal for, for example, display by a television.

Also, the computer system 100 can be part of a computer network (for example, a LAN) using an optional network connector 127, being coupled to the bus 101. In one embodiment of the invention, an entire network can then also be considered to be part of the computer system 100.

An optional device 128 can optionally be coupled to the bus 101. The optional device 128 can include, for example, a PCMCIA card and a PCMCIA adapter. The optional device 128 can further include an optional device such as modem or a wireless network connection.

2.0 Definitions

A digital circuit in an interconnected collection of parts. Parts may also be called cells. The digital circuit receives signals from external sources at points called primary inputs. The digital circuit produces signals for external destinations at points called primary outputs. Primary inputs and primary outputs are also called ports. Each part receives input signals and computes output signals. Each part has one or more pins for receiving input signals and producing output signals. In general, pins have a direction. Most pins are either input pins, which are called loads, or output pins, which are called drivers. Some pins may be bidirectional pins, which can be both drivers and loads.

Two or more pins from one or more parts or primary inputs or primary outputs are connected together with a net. Each net establishes an electrical connection among the connected pins, and allows the parts to interact electrically with each other. Pins are also connected to primary inputs and primary outputs with nets. For the sake of simplicity, parts may be said to be "connected" to nets, but it is actually pins on the parts which are connected to the nets.

A Circuit Element is any component of a circuit. Ports, pins, nets, and cells are all circuit elements. Any circuit element which is an input to another circuit element is said to drive that circuit element. Any circuit element which is an output of another circuit element is said to load that circuit element. For example, drivers drive a signal onto a net; loads load nets with capacitance.

A digital circuit design can be stored in memory of a computer system using data structures which represent the various components of the circuit. The data structures have the same name as the physical components. In this document, parts, cells, sets, pins, and other digital circuit components refer to the software representation of the physical digital circuit component.

A digital circuit can be specified hierarchically. Some or all of the parts in the digital circuit may themselves be digital circuits composed of more interconnected parts. When a high level part is specified as a digital circuit composed of other, lower level parts, the pins of the high level part become the primary inputs and primary outputs for the digital circuit comprising the lower level parts. When a high level part is composed of lower level parts, it is called a level of hierarchy.

Following are additional definitions of terms which are used in this document.

An HDL is a Hardware Description Language. HDL's are used to describe designs for digital circuits.

A Translated Circuit, Generic Technology Circuit, or GTech Circuit is a software representation of a digital circuit which does not include references to a specific technology, but rather refers to cells that implement generic logic such as "and", "or", and "not". This software representation is stored in memory 104 of computer system 100.

A Mapped Circuit is a software representation of a digital circuit which is built from parts available in a technology library which is provided by a silicon vendor. This software representation is stored in memory 104 of computer system 100. A mapped circuit can be timed using a conventional timing verifier such as DesignTime, available from Synopsys. Inc. in Mountain View, Calif. After it is built, a netlist representation of a mapped circuit can be sent to a silicon vendor for layout and fabrication. For instance, the mapped circuit can be written out using LSI netlist format and sent to LSI Logic in Milpitas, Calif. The process of creating a mapped circuit from a generic technology circuit is called mapping. Because a circuit must be mapped before it can be timed, mapped circuits are also used internally by synthesis tools.

The Fanout of a circuit element includes any circuit elements which are driven by that circuit element. The transitive fanout of a circuit element includes all of the circuit elements in the circuit which are driven, either directly or indirectly, by that circuit element. Thus, the transitive fanout of a circuit element includes the fanout of that circuit element, as well as the fanout of each of the circuit elements in the original fanin, and so on.

The Fanin of a circuit element includes any circuit elements which drive that circuit element. The transitive fanin of a circuit element includes all of the circuit elements in the circuit which drive, either directly or indirectly, that circuit element. Thus, the transitive fanin of a circuit element includes the fanin of that circuit element, as well as the fanin of each of the circuit elements in the original fanin, and so on.

An Operator is a function, such as addition. Such functions are used in HDL source code. For example, the plus in "c=a+b;" is an operator.

An Operation is a software representation of a hardware functional unit which performs a function such as addition. For example, a software representation of an adder is an operation.

A Clock Cycle is a period of time, for example, 10ns, between pulses of a clocking element in a digital circuit. The clocking element is used to synchronize the digital circuit.

3.0 Scheduling

Scheduling is a well defined problem which has been studied extensively. An overview of the scheduling problem is available in The High-Level Synthesis of Digital Systems by Michael McFarland, Alice Parker, and Raul Camposano, in Proceedings of the IEEE, February 1990, which is hereby incorporated by reference.

The input to a scheduler is typically a set of hardware operations, a set of constraints between the hardware operations, a clock period, and a set of control steps into which the hardware operations must be mapped. The output is a schedule where each hardware operation is mapped to a control step.

Schedulers typically use a number of graphs. For instance, the constraints for a scheduler are often represented using a graph. Nodes in the graph typically represent events to be scheduled, such as operations, and edges in the graph represent constraints between the events. The scheduler checks the constraint graph to ensure that all of the constraints are met before placing an event into a particular control step. Schedulers also use control graphs, data flow graphs, and combination control data flow graphs (CDFG's). Control graphs represent the flow of control in a circuit. Data flow graphs represent the flow of data in a circuit; that is the flow of data from the inputs to the outputs of the circuit. Control data flow graphs combine both control flow and data flow information into a single graph. All of these types of graphs are described in High-Level Synthesis (subtitled Introduction to Chip and System Design) by Daniel Gajski, Nikil Dutt. Allen C-H Wu, and Steve Y-L Lin, Kluwer Academic Publishers, 1992 which is hereby incorporated by reference and will subsequently be referred to as High-level Synthesis by Gajski et al.

An additional technique used for scheduling circuits involves "templates". Templates are described in Scheduling using Behavioral Templates by Tai Ly, David Knapp, Ron Miller, and Don MacMillen in Proceedings of the 31st DAC, June 1995, which is included as Appendix A and is hereby incorporated by reference. Simply speaking, templates are data structures which specify scheduling constraints among CDFG nodes. Templates "lock" the control step relationship between 2 or more CDFG nodes. FIG. 13 shows an example of two templates, template 1250 and template 1280. Each template contains one or more nodes, some of which may represent operations. For example, adder node 2020 represents adder 3120 of FIG. 12.

3.1 Overview of Synthesis with Scheduling

Figure 6:
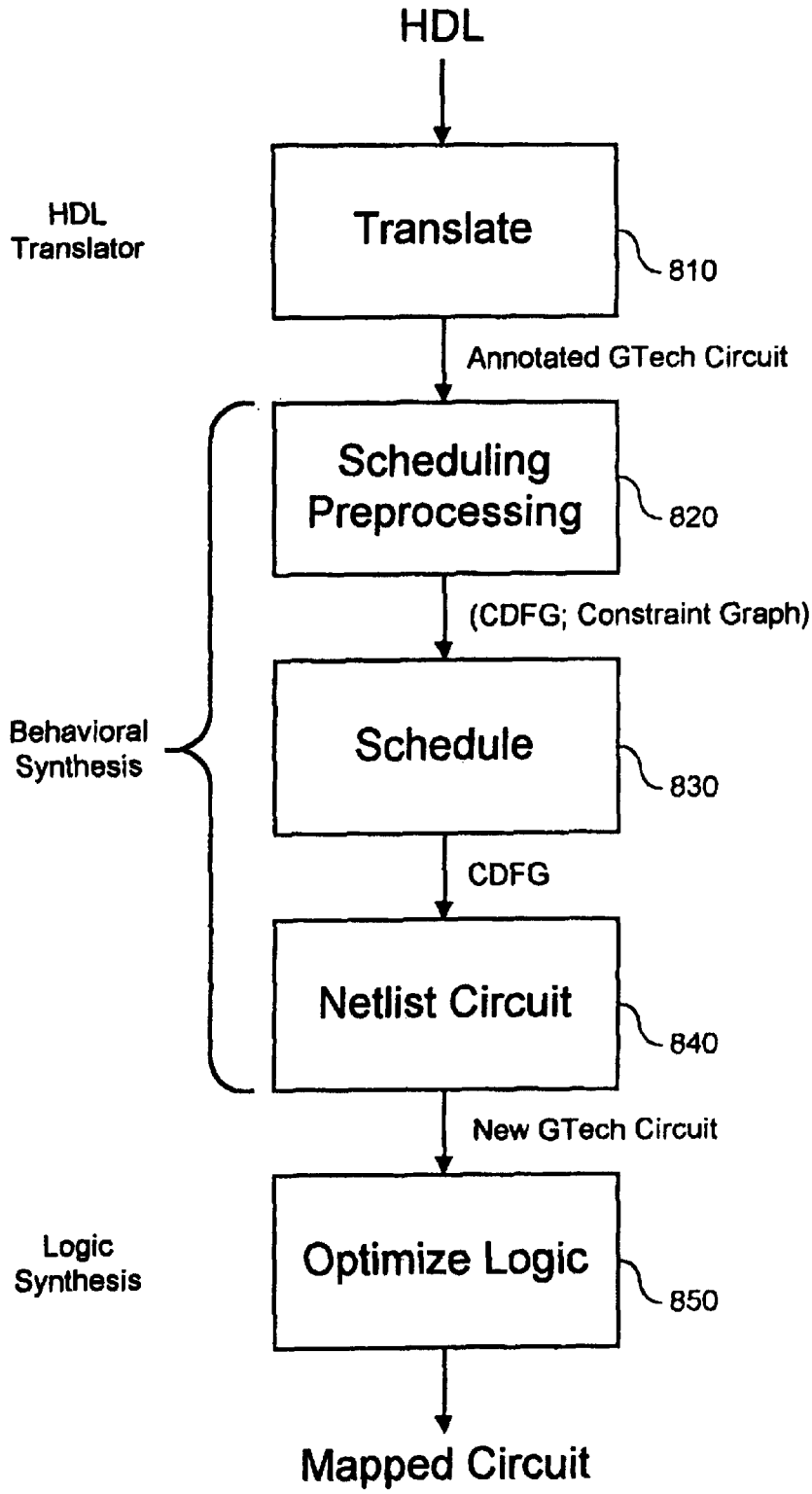
FIG. 6 is a flowchart which shows steps in a circuit synthesis process.

FIG. 6 is a flowchart showing how scheduling steps fit into the overall synthesis strategy. This flowchart shows how a mapped circuit is created from a source HDL description. The input to synthesis is an HDL description of a digital circuit. Such a description may be written in VHDL, Verilog, or some other HDL.

An HDL description is translated in step 810 to generic logic. A conventional HDL translator 1310 such as VHDL Compiler version 3.2b from Synopsys. Inc. in Mountain View, Calif. preferably is used.

Figure 7:
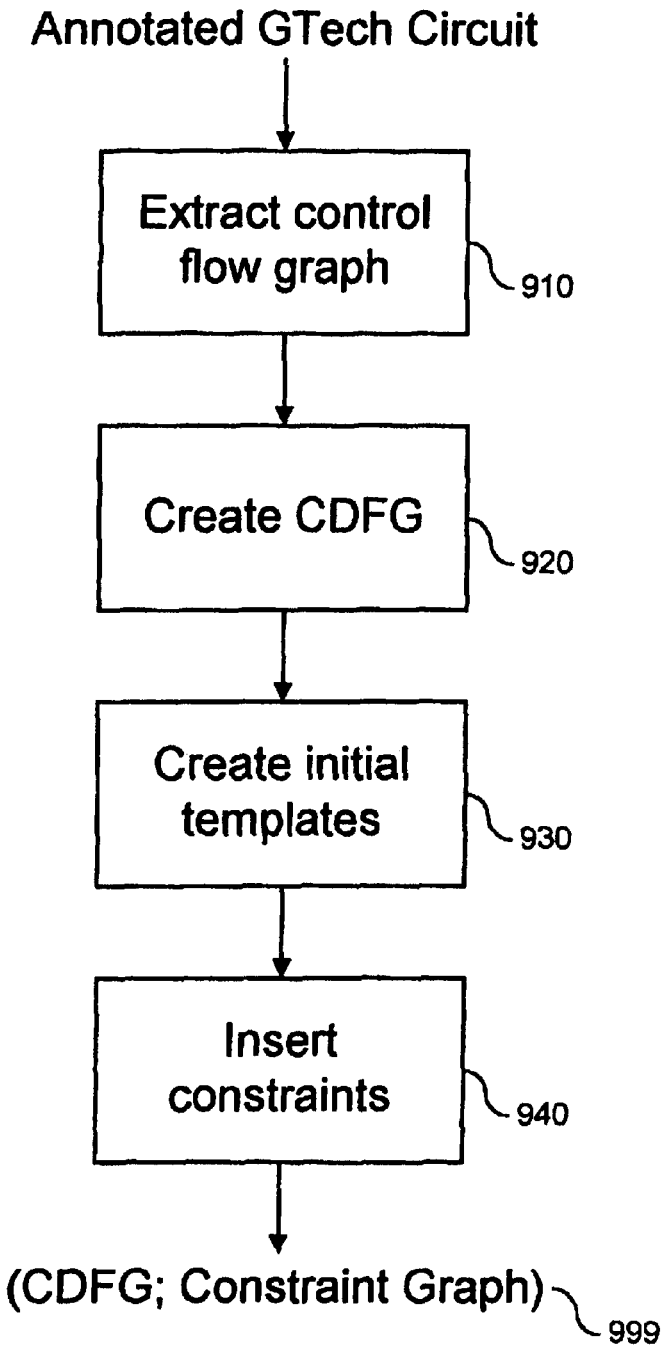
FIG. 7 is a flowchart which shows steps for scheduling preprocessing.
Figure 8:
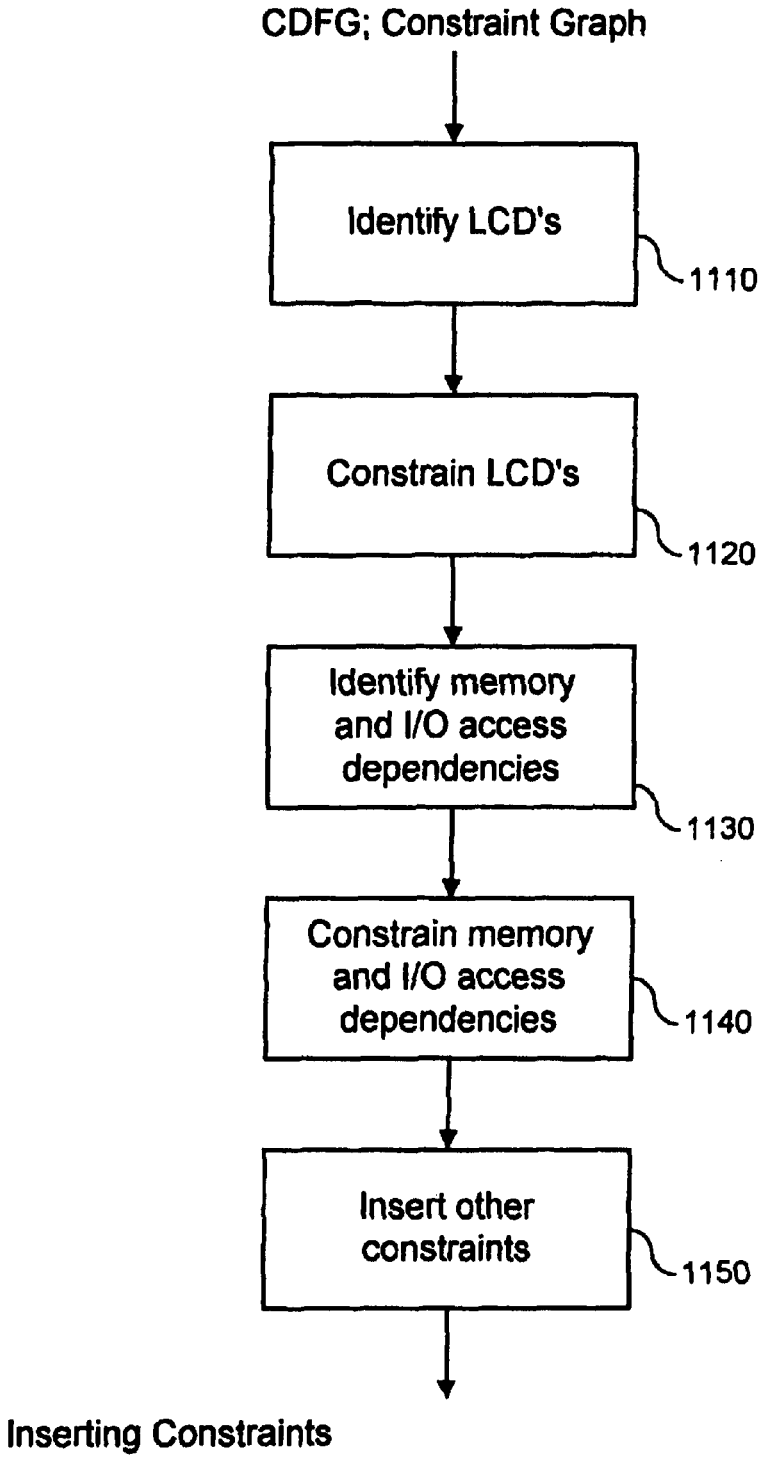
FIG. 8 is a flowchart which shows steps for inserting constraints into a constraint graph.

Step 820 performs scheduling preprocessing steps. These steps are shown in FIG. 7 and FIG. 8.

Figure 9:
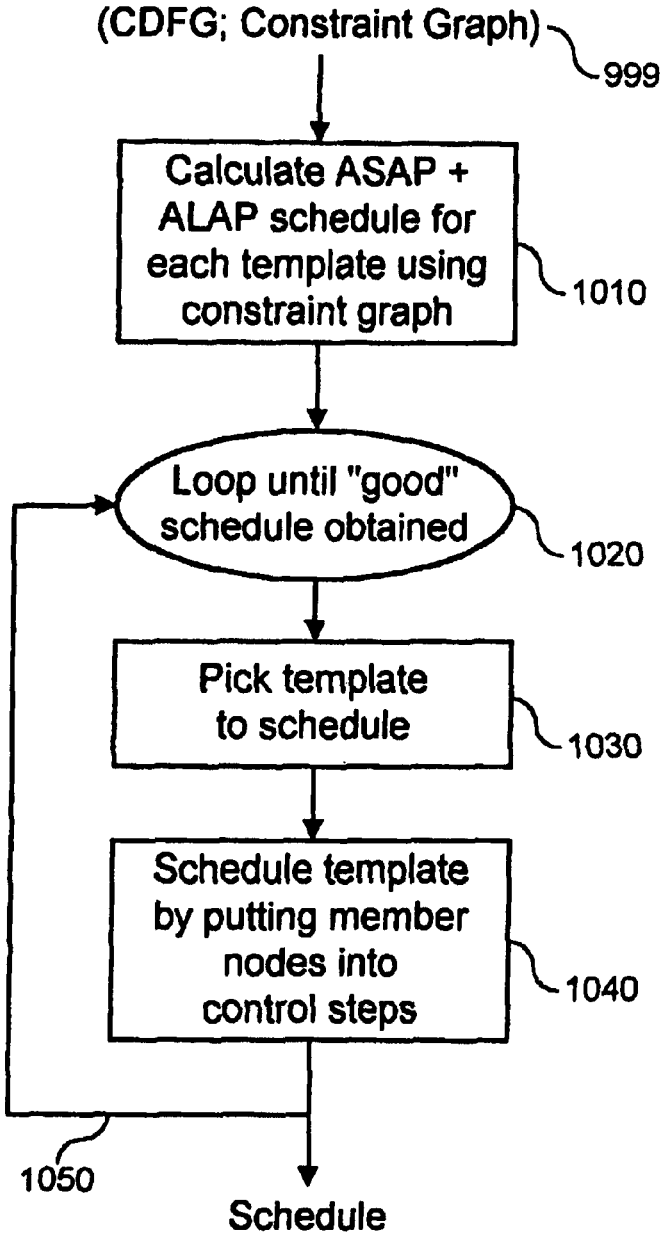
FIG. 9 is a flowchart which shows steps for scheduling templates.

Step 830 schedules the operations in the circuit. A method for scheduling the operations in the circuit is shown in FIG. 9.

Step 840 netlists the scheduled circuit. Netlisting creates a GTech circuit from the scheduled CDFG. The CDFG representation of the circuit in memory is transformed into a GTech representation of the circuit in memory.

In step 850, the resulting GTech circuit is optimized using conventional logic synthesis such as Design Compiler version 3.2 by Synopsys. Inc. in Mountain View, Calif. The output of logic optimization is a mapped circuit description which can be sent to a silicon vendor for fabrication. For example, a description of the mapped circuit can be output using LSI Netlist format and sent to LSI Logic in Milpitas, Calif for fabrication.

3.2 Scheduling Preprocessing

FIG. 7 is a flowchart which shows steps for scheduling preprocessing. The input to the method is an annotated GTech circuit. Annotation on the circuit include delayed signal assignment information. The use of delayed signal assignments will be discussed in a later section.

Step 910 extracts a control graph from the annotated GTech using conventional techniques. In addition, information concerning delayed signal assignments is extracted as described below.

Step 920 extracts a Control Data Flow Graph (CDFG) from the control graph created in step 910 and the data flow graph represented by the GTech circuit. This is also done using conventional techniques.

Step 930 creates initial templates for the operations in the CDFG as described in Scheduling Using Behavioral Templates in Appendix A. These initial templates form the initial constraint graph.

Step 940 inserts constraints in the constraint graph. Some types of constraints are discussed in Scheduling Using Behavioral Templates in Appendix A. Other types of constraints are a part of the present invention and will be discussed in subsequent sections.

3.3 Inserting Constraints

Step 940 of FIG. 7 is implemented by FIG. 8 which is a flowchart which shows steps for inserting constraints into a constraint graph which uses templates. The input to the process is a CDFG and a constraint graph.

Step 1110 identifies Loop Carry Dependency (LCD) producer consumer pairs. LCD's are identified by tracing the CDFG using conventional techniques. LCD's are discussed below in connection with FIG. 11, FIG. 12, FIG. 13, FIG. 14, and FIG. 27.

Step 1120 constrains the LCD's. Constraining LCD's involves adding constraints to the constraint graph so that producer and consumer operations are scheduled so that the consumer consumes a value produced by the producer before it is overwritten in a subsequent iteration of the loop. A method and apparatus for constraining LCD's will be discussed in a later section.

Step 1130 identifies memory and I/O access dependencies in loops which will be scheduled using pipelines. I/O accesses include reads and writes to memories, signals, and ports. Reads and writes in one iteration of the loop may not "cross," or occur after, reads and writes in subsequent iterations of the loop. Specifically, all reads and writes to the same memory, and all reads and writes to the same signal or port in one iteration of the loop must occur before any reads or writes to the same memory, signal or port in a subsequent iteration of the loop. The one exception to this rule is that reads of the same signal or port may occur simultaneously to a read of the same signal or port in a subsequent iteration of the loop. This step finds the first and last accesses for each memory, signal, or port by tracing through the CDFG using conventional techniques. Memory and I/O accesses are discussed below in connection with FIG. 15, FIG. 16, FIG. 17, FIG. 18, and FIG. 28.

Step 1120 constrains the memory and I/O accesses in pipelined loops. Constraining memory and I/O accesses involves adding constraints to the constraint graph so that first and last accesses are scheduled so that the last access occurs before the first access in a subsequent iteration of the loop. A method and apparatus for constraining memory and I/O accesses will be discussed in a later section.

Step 1130 inserts other types of constraints into the constraint graph. Such constraints are discussed in Scheduling Using Behavioral Templates in Appendix A. An example of another type of constraint is a dataflow constraint, which ensures that data values are produced before they are consumed by subsequent operations.

3.4 Scheduling Templates

FIG. 9 is a flowchart which shows steps of scheduling (step 830 of FIG. 6) using templates. The input to the process is the CDFG and the constraint graph created by the steps of FIG. 8. It is possible to schedule templates using many different scheduling techniques. A number of scheduling techniques are described in High-Level Synthesis by Gajski et al, particularly in Chapter 7. This figure shows a general method, which is provided as an example.

Step 1010 creates the As Soon As Possible (ASAP) and As Late As Possible (ALAP) schedules for each template while satisfying the constraints represented in the constraint graph. The ASAP schedule places each template into the earliest possible control step (c-step). The ALAP schedule places each template into the latest possible control step. Together, the earliest and latest control steps define a range into which each template may be scheduled. A method for determining the ASAP and ALAP schedules for templates is described in Scheduling Using Behavioral Templates in Appendix A.

Loop 1020 loops until a "good" schedule is found. A "good" schedule is one which fulfills the constraints specified in the constraint graph and optimizes for a specific goal specified by a human designer, such as fewest number of control steps. Different scheduling techniques use different criteria for deciding when to stop trying to improve the schedule. For example, one technique might stop when the constraints are all met, or when a certain amount of CPU time has been spent, whichever comes last.

Step 1030 picks a template in the constraint graph to schedule. Different techniques use different criteria for deciding what to schedule next. Generally, template scheduling techniques use criteria based upon the operations in a template. For instance, a list scheduling technique which uses priorities will assign a priority to a template based on the priorities of the operations within the template. (List scheduling is described in High-Level Synthesis by Gajski et al in Chapter 7).

Step 1040 schedules the chosen template in the control step chosen by the scheduling technique being used. Templates are scheduled by placing the first operation within the template into the chosen control step and the remaining operations within the template into subsequent control steps as defined by the template.

Arrow 1050 indicates that loop 1020 iterates until a "good" schedule is found.

4.0 Method for Creating Constraints

This section describes a general technique for constraining the relationship between two nodes in a constraint graph. Such constraints are added in step 940 of FIG. 7. The section then describes examples of using this technique to constrain loop carry dependencies and I/O dependencies.

4.1 Placeholder Node Method

Figure 10:
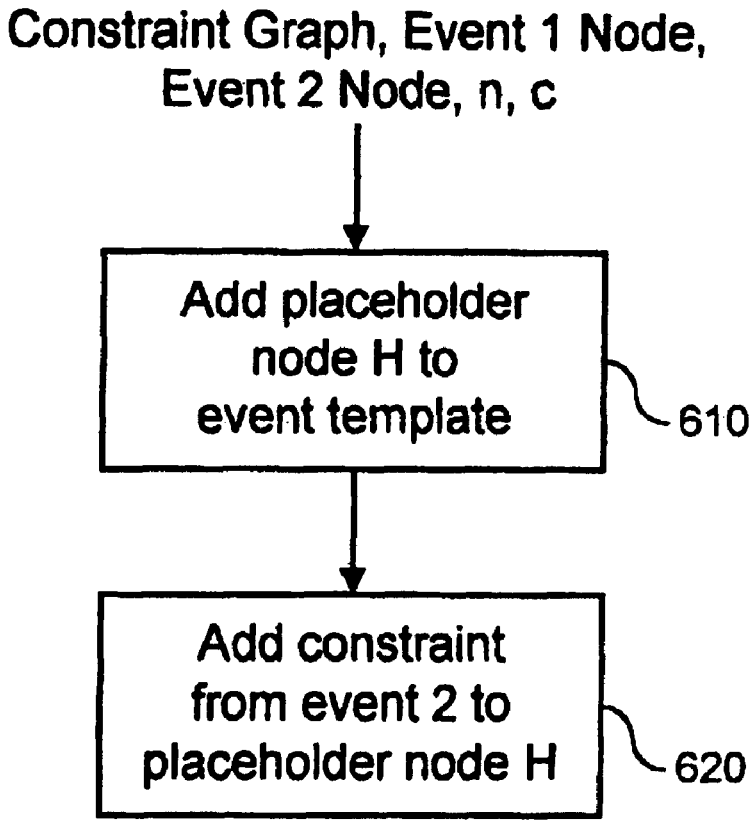
FIG. 10 is a flowchart which shows steps for creating a constraint using templates.

FIG. 10 shows a general method for creating a scheduling constraint between two nodes in a constraint graph. Such constraints are created in step 1120 and step 1140 of FIG. 8 to constraint LCD's and memory and I/O accesses. This section shows a general method and discusses specific examples. The first example constrains an LCD; the second example constrains a pair of signal reads. The input to the process of FIG. 10 is a constraint graph, two templates in the graph, Event 1 and Event 2, an integer n, and a number of cycles c. "n" is the number of cycles within which Event 2 must be scheduled after Event 1. "c" is either 0 or 1. "c" has value 0 when Event 2 must be schedule before n cycles after Event 1, and value 0 when Event 2 may be scheduled exactly n cycles after Event 1.

Step 610 adds a placeholder node H to the template for Event 1 in the constraint graph. A placeholder rode is a node in the constraint graph which is only used to create constraints. The placeholder node does not represent any portion of the final circuit. Placeholder node H is inserted into the Event 1's template such that it is locked n cycles after Event 1.

Step 620 adds a constraint in the constraint graph from Event 2 to placeholder node H which constrains Event 2 to occur c cycles before placeholder node H, where c is 0 or 1. The value of c depends on the constraint being added and will be discussed in subsequent sections.

4.2 Using Placeholder Nodes for Loop Carry Dependencies

The following section provides an example of constraining loop carry dependencies using placeholder nodes. Such constraints are created in step 1120 of FIG. 8. A loop carry dependency is a data value which is produced in one iteration of a loop and consumed by operations in subsequent iterations of the loop. To use the placeholder node method to schedule loop carry dependencies. Event 1 is set to be the operation which consumes the data. Event 2 is set to be the operation which produces the data. Event 2 must be scheduled so that the correct data values are driving it when it feeds its outputs to Event 1. If the consumer (Event 1) consumes the data one iteration after the producer (Event 2) creates it, then n is set to be the initiation interval of the loop. If the consumer consumes the data k iterations after it is created by the producer, then n is set to be k * initiation interval. For LCD's, "c" has value "1" because the producer must be scheduled before the consumer in the subsequent iteration of the loop.

FIG. 11 shows an example of Verilog source code for a loop 3030 with a loop carry dependency between addition 3020 and subtraction 3010. The output of addition 3020, p, drives the input of subtraction 3010 on the next iteration of the loop. "p" is a Loop Carry Dependency. In this example, a human designer has specified that loop 3030 will be scheduled using an initiation interval of 2 and a latency of 4. Although this loop would not usually be pipelined because pipelining does not increase its throughput, this simple example is used for the sake of clarity.

FIG. 12 shows a GTech circuit representation 2000 which is created for loop 3030 in FIG. 11. The GTech circuit representation is stored in memory 104. GTech circuit 2000 is output from step 810 of FIG. 6. Addition 3020 is implemented as adder 3120, and subtraction 3010 is implemented as subtracter 3110. Port p 2040 drives subtracter 3110. Port p' 2045 is driven by adder 3120. Port p 2040 and port p' 2045 are partner ports. Partner ports are ports which represent the same signal, and thus frequently embody loop carry dependencies. Partner ports contain references to their partners. In the described embodiment, these references are implemented as pointers. Each port which has a partner contains a pointer to its partner port.

Figure 13A:
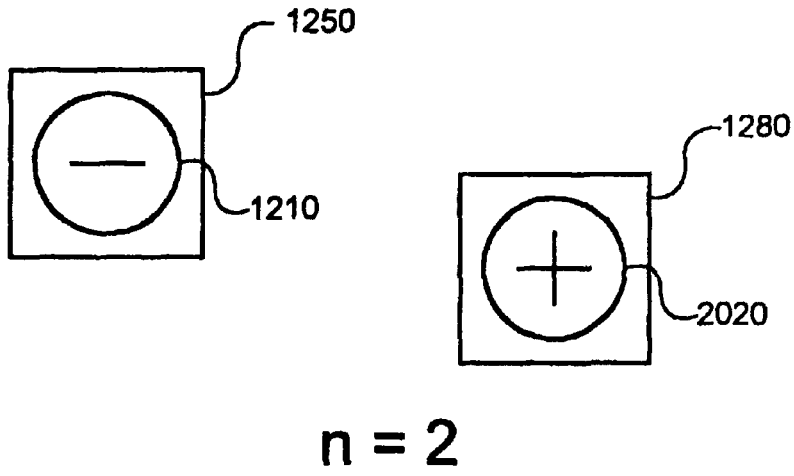
FIG. 13 shows a constraint created for a producer and consumer in loop 3030.
Figure 13B:
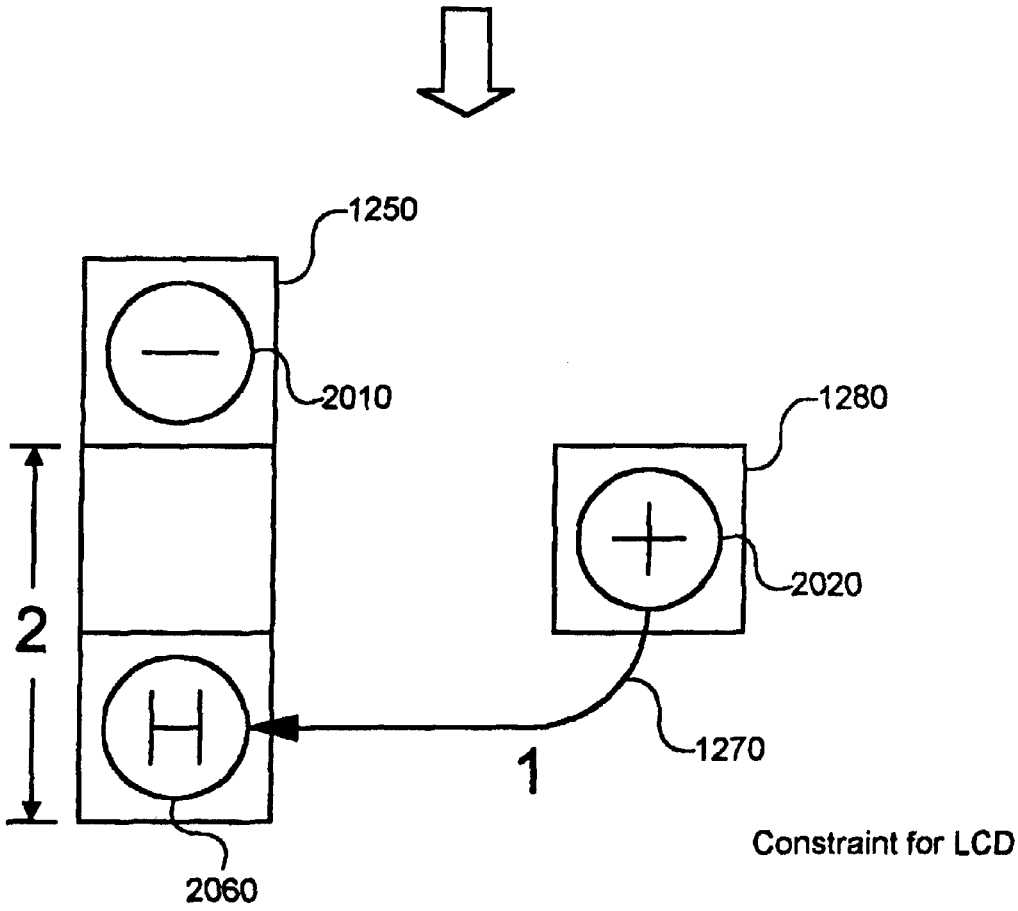

FIG. 13 shows a constraint 1270 between adder node 2020, which is the producer for this LCD, and subtracter node 2010 which is the consumer of this LCD. The consumer and producer were identified in step 1110 of FIG. 8. This constraint is created using the method of FIG. 10. The starting templates are shown in FIG. 13(a). First step 610 of FIG. 10 adds placeholder node H 2060 to the template 1250 of subtracter node 2010. Because the initiation interval for the loop is 2, placeholder node H 2060 is constrained to be 2 cycles after subtracter node 2010 by template 1250. Next, step 620 creates constraint 1270, represented by an arrow, which constrains adder node 2020 to be at least one cycle before placeholder node H 2060. The modified templates and the new constraint are shown in FIG. 13(b). The new constraint is then used to schedule the loop correctly using a method such as the one shown in FIG. 9.

FIG. 27 shows the add and subtract operations of FIG. 12 scheduled into control steps by step 830 of FIG. 6. For the sake of clarity, the other operations in the circuit are not shown. Two iterations of the loop are shown, to demonstrate how the schedule properly handles the loop carry dependency. Adder 3120 is scheduled so that its result is available before subtracter 3110 needs it in the next iteration of the loop.

Figure 14:
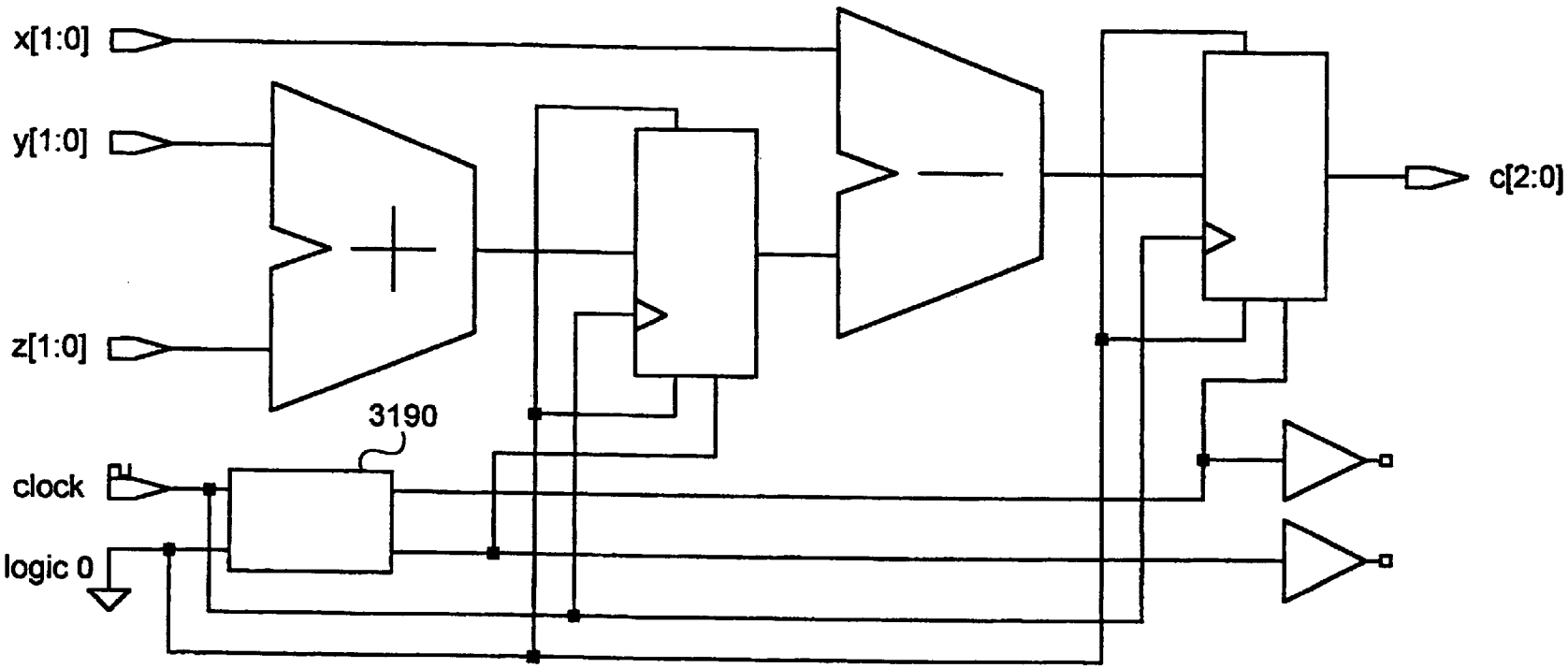
FIG. 14 shows a circuit which is created after scheduling loop 3030 using an initiation interval of 2 and a latency of 4.

FIG. 14 shows the circuit created from the Verilog HDL source code of FIG. 11 after scheduling. Block 3190 represents the representation of the FSM controller for this circuit stored in memory 104.

4.3 Using Placeholder-Nodes for I/O Dependencies

Loop pipelining must preserve the original order of all reads and writes to the same memory, signal, or port. The placeholder node method can be used to create constraints which ensure that I/O accesses is different iterations of the loop do not cross one another. Such constraints are created in step 1140 of FIG. 8. The last I/O access to the same memory, signal, or port in a loop must occur simultaneously to or before the first I/O access to that memory, signal or port in the next iteration of the loop. Specifically, reads of the same signal or port may occur simultaneously with reads in the next iteration of the loop, but not after. Writes to the same signal or port must occur before any read or write to the same signal or port in the next iteration of the loop. Reads and writes to the same memory must occur before any read or write to the same memory in the next iteration of the loop.

Thus, any last I/O access must occur within the initiation interval of the first I/O or memory access. To create this constraint, Event 1 of FIG. 10 is set to be the first I/O access to a given memory, signal or port. Event 2 of FIG. 10 is set to be the last I/O access to a given memory, signal or port. n is set to be the initiation interval of the loop, and c is set to be 0 or 1. Specifically, c is set to be 0 if Event 1 and Event 2 are signal or port reads, c is set to be 1 if Event 1 or Event 2 are signal or port writes, or memory reads or writes.

FIG. 15 shows an example of Verilog source code for a loop 1530 with an I/O dependency between read 1510 and read 1520. Both read 1510 and read 1520 read the value of the same signal, x. Thus, read 1520 must be scheduled such that it occurs before read 1510 in the next iteration of the loop. In this example, a human designer has specified that this loop 1530 will be scheduled using an initiation interval of 1 and a latency of 3.

FIG. 16 shows the GTech circuit 1500 which is created for loop 1530 of FIG. 15. Circuit 1500 is output from step 810 of FIG. 6. Read 1510 is implemented by read operation 3130. Read 1520 is implemented by read operation 3140. In this example, a human designer has specified that this loop will be pipelined with an initiation interval of 1 and a latency of 3.

Figure 17A:
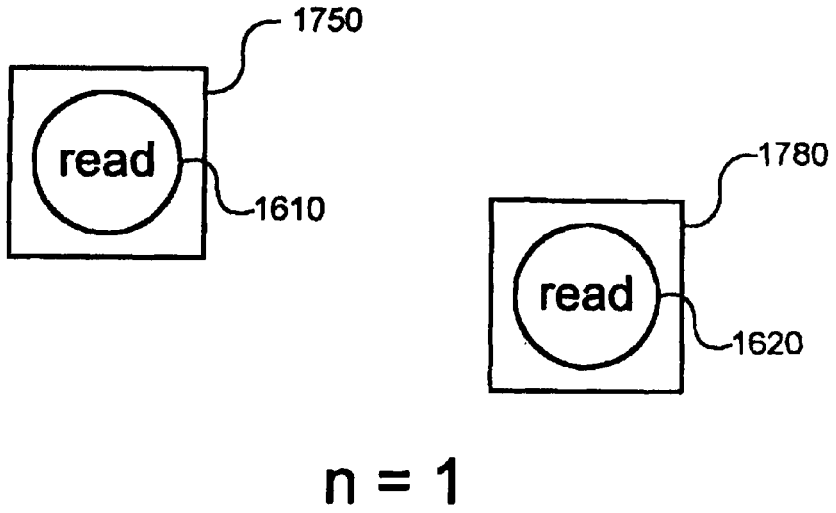
FIG. 17 shows a constraint created for two reads in loop 1530.
Figure 17B:
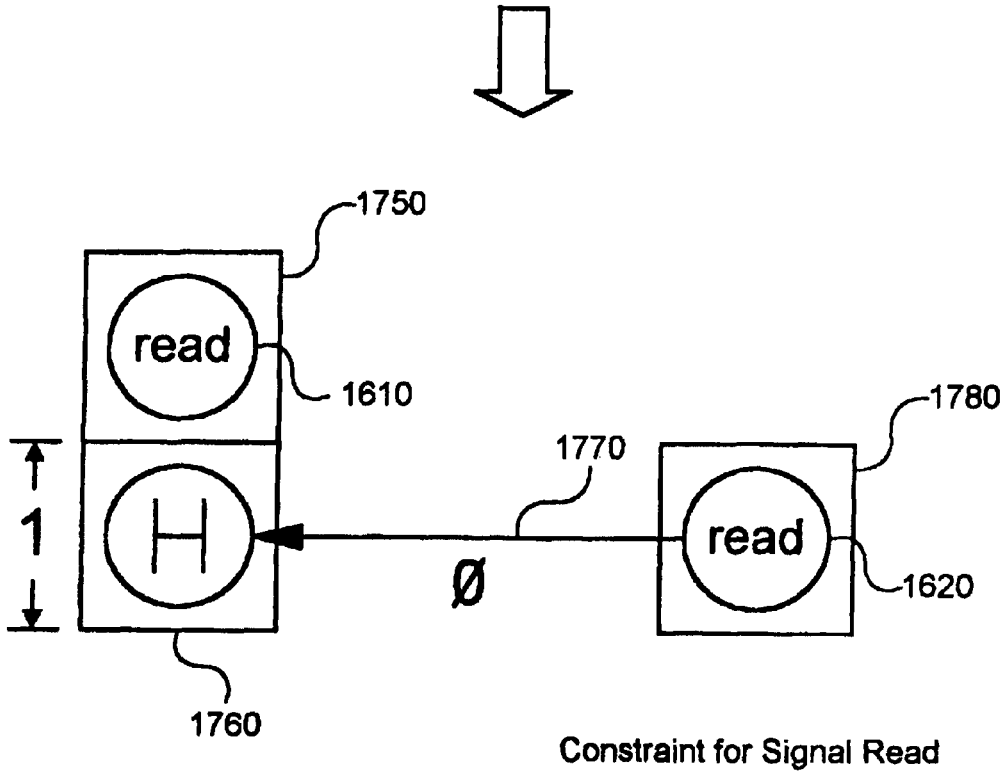

FIG. 17 shows a constraint between read node 1610, the first read of x in loop 1530, and read node 1620, the last read of x in loop 1530. Read node 1610 and read node 1620 were identified in step) 1130 of FIG. 8. This constraint is created using the method of FIG. 10. First step 610 adds placeholder node H 1760 to the template 1750 of read node 1610. Placeholder node H is constrained to be 1 cycle after read node 1610, because the initiation interval is 1, by template 1650. Next, step 620 creates constraint 1770, represented by an arrow, which constrains read node 1620 to be at least 0 cycles before, that is in the same cycle or after, placeholder node H 1760. Read node 1620 is constrained to be 0 cycles before placeholder node H 1760 because read node 1620 and read node 1610 are both signal reads, and as such are allowed to occur in the same control step. Constraint 1770 is then used to schedule the loop correctly using a method such as the one shown in FIG. 9.

FIG. 28 shows read operations on signal x of FIG. 16 scheduled into control steps by step 830 of FIG. 6. For the sake of clarity, the other operations in the circuit are not shown. Two iterations of the loop are shown, to demonstrate how the schedule properly handles the multiple signal reads. Read 3130 is scheduled so that it occurs simultaneously with read 3140 in the next iteration of the loop. Since simultaneous signal reads are allowed, this is a legal schedule.

Figure 18:
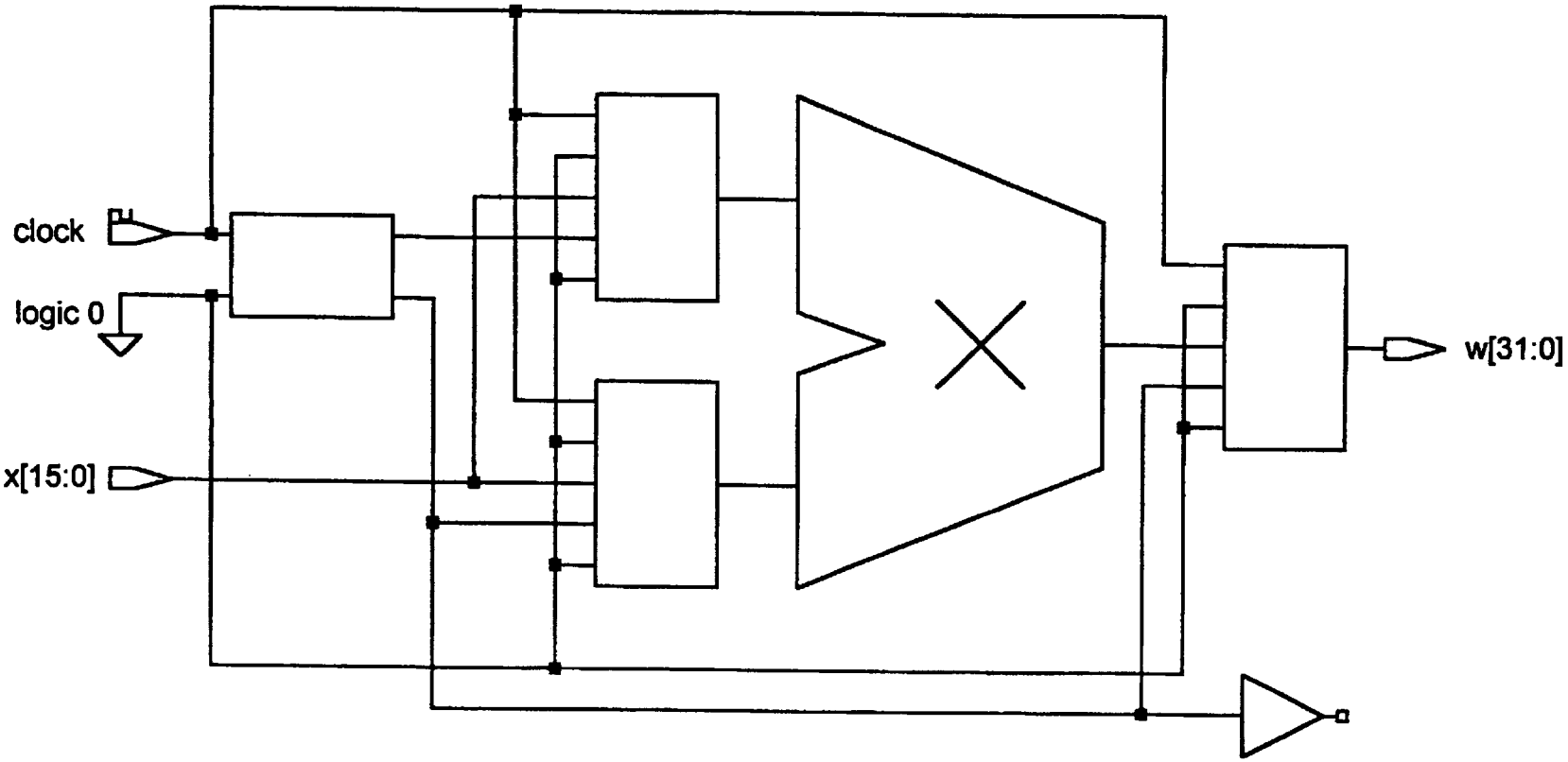
FIG. 18 shows a circuit which is created after scheduling loop 1530 using an initiation interval of 2 and a latency of 4.

FIG. 18 shows the circuit created from the Verilog HDL source code of FIG. 11 after scheduling.

5.0 Circuit Synthesis using Delayed Signal Assignment Information

Conventional design methodology uses a simulator to verify the correctness of a design both before and after it is synthesized. Conventional simulation systems, especially those systems performing behavioral synthesis, do not always yield identical cycle timing characteristics when HDL source code is simulated and when a synthesis output (a representation of a synthesized circuit) is simulated. It is advantageous for behavioral synthesis to be able to infer a circuit which will have the same cycle by cycle behavior during simulation as the simulation of the source HDL.

The source code of FIG. 19(a) is written in the Verilog circuit specification language. The source code of FIG. 19(b) is written in the VHDL circuit specification language. Both Verilog and VHDL are Hardware Description Languages (HDLs).

In FIG. 19(a), the Verilog source code includes a signal assignment statement:

```
c<=#24x-p;
```

This statement includes a delay clause ("#24") indicating that a delay of twenty-four time units, e.g., nanoseconds, should pass before the write operation is performed by the circuit that is to be generated. The delay clause is an example of delayed signal assignment information. Note that the inclusion of the delay clause in the HDL indicates a delay of the write operation only. The delay clause does not cause a delay in the performance of the subtraction operation. Similarly, in FIG. 19(b), the VHDL source code includes a signal assignment statement:

```
c<=transports-p after 24 ns;
```

This statement also contains a delay clause ("after 24 ns") indicating that a delay of twenty-four time units should occur in the generated circuit before the write operation is performed. This delay clause is a further example of delayed signal assignment information.

A circuit loop generated from the HDL source code of FIG. 19(a) and FIG. 19(b) will have an initiation interval of "2" because each source code example has two "wait" (or "posedge" or "negedge") statements within the loop. As discussed below, the delay clause in the source code causes the resulting loop to have a loop latency of "4". FIG. 19(a) and FIG. 19(b) are included for the purpose of example only. The present invention can use any appropriate type of source code (VHDL, Verilog, etc.) to represent a delay clause.

FIG. 20 is a flowchart showing steps performed during translation step 810 of FIG. 6 to generate a cdb. The exact placement of the steps of FIG. 20 are not a part of the present invention and the steps also can be performed, for example, in the preprocessing step 820 of FIG. 6. The input to FIG. 20 is a representation of one of the source code examples of FIG. 19(a) and FIG. 19(b), such as a parse tree generated from the source code. The steps of FIG. 20 are performed for each statement in the source code. The output of the translation step 810 and FIG. 20 is a data flow graph (a "Gtech circuit") and a control flow graph (a "control data base" (cdb)). It will be understood by persons of ordinary skill in the art that the steps of FIG. 20 and FIG. 23 are performed by processor 109 of FIG. 5, performing instructions stored in memory 104 of FIG. 5.

In step 2002, the processor determines whether the current source code statement is a signal assignment statement (e.g., an assignment to a port using the "<=" operator) that includes a delay clause (e.g., "#24" in Verilog or "after 24 ns" in VHDL). If not, in step 2002, the processor performs standard processing for the node to build a node in the data flow graph. If the current source code statement includes a delay clause, then, in step 2004, the processor builds a write operation node in the data flow graph and annotates the node by adding an attribute indicating delayed signal assignment information to show that the write operation corresponding to the write operation node has a delay of, e.g., 24 nanoseconds (see node 2114 of FIG. 21 and FIG. 22).

FIG. 21 shows an example of a data flow graph 2100 generated from one of the source code examples of FIG. 19(a) and FIG. 19(b) in accordance with the steps of FIG. 20. A representation of data flow graph 2100 is stored in memory 104. Data flow graph 2100 includes as inputs a port x, a register p, and ports y and z. Each port has zero or more read operation nodes ("read op") 2102, 2014, 2106 associated therewith and each read operation node has an attribute indicating a port name (e.g., "port='x'"). Respective ones of the inputs are input to a subtracter node 2110 and an adder node 2112. Subtracter node 2110 is connected to a write operation node 2114. Adder node 2112 is connected to a variable assignment node 2116. Output p' is input as p during successive iteration of the loop. Thus, the data flow graph of FIG. 21 has seven nodes representing the data flow in the circuit to be synthesized.

In step 2008 of FIG. 20, if there are more statements in the source code, control returns to step 2002. If all statements have been processed and a data flow graph (including signal delay attributes) has been generated for the source code, control passes to step 2012, where a control flow graph, such as that in FIG. 22 is created.

Control graph 2200 of FIG. 22 adds control information to nodes 2102, 2104, 2106, 2110, 2112, 2114, and 2116 indicating the order and conditions under which the data flow nodes are executed in the synthesized circuit. A representation of control graph 2200 is stored in memory 104 of FIG. 5. The present invention preferably operates in a "cycle fixed mode" in which each "wait" (or "posedge" or "negedge") statement in the source code indicates a new cycle in the synthesized circuit. Various processes for generating of control flow graphs are known to person of ordinary skill in the art and are described in High-Level Synthesis of Gajski et al.

In FIG. 22, cnodes are used as "placeholder" nodes in the control graph to represent a collection of data flow nodes. Thus, cnode 2200 is associated with write operation node 2114 (including the signal delay attribute), read operation node 2102, and subtracter node 2110. The wait nodes in FIG. 22 are used to represent the transitions between each cycle (or "cstep"). A wait node 2204 is used to mark the transition between the first cstep (cstep 0) and the second cstep (cstep 1). Wait node 2204 also has attributes indicating that it is based on a rising clock edge (due to the "posedge" statement in the source code) "Wait statements" (in VHDL source code) are treated similarly. Cnode 2206 (located in the second cstep) is associated with variable assignment node 2116, read operation node 2104, read operation node 2106, and adder node 2112. The control graph also includes a second wait node 2208 and a third cnode 2210.

As shown in FIG. 7, the control flow graph is input to step 920, where a control data flow graph (CDFG) is created. The general procedure for creating a conventional CDFG is known to person of ordinary skill in the art and is described in High-Level Synthesis by Gajski et al. FIG. 23 shows certain details of the process of creating a CDFG that relate to the delay clause of the present invention. An example CDFG is shown in FIG. 24. The steps of FIG. 23 are performed for each loop in the control flow graph. In step 2302, the processor sets a Wait_count variable and a Max_wait_count variable in the memory 104 to an initial value of "0". In step 2304 the processor builds a "loop begin" node in the CDFG and assigns to it a cstep attribute value equal to "0".

Step 2306 is a first step in a loop performed by the processor for each cdb node. In step 2308, if the current cdb node is a cnode, control passes to step 2310, which is a first step in a loop performed for all data flow nodes associated with the current cdb node. In step 2312, if a current data flow node is a write operation node having a delay clause (i.e., if the current data flow node represents a delayed signal assignment), control passes to step 2322.

In step 2322, a temp_wait_count variable is set to the current value of Wait_count + a number of delay time units in the delayed signal assignment divided by the clock period (e.g. $0+24/6=4$). A CDFG node is created and assigned to cstep temp_wait_count in step 2324. In step 2326, if temp_wait_count is greater than Max_wait_count, then in step 2328. Max_wait_count is set equal to temp_wait_count. Otherwise, control passes to step 2342. If, in step 2342, there are more data flow nodes associated with the current cdb node, then control passes to step 2310. Otherwise control passes to step 2336.

If, in step 2312, the current data flow nodes not a delayed signal assignment, the processor builds a standard CDFG node in step 2314 and assigns the created data flow node to cstep wait_count in step 2316. If, in step 2318, wait_count is greater than Max_wait_count, the Max_wait_count is assigned to wait_count in step 2320. Control next passes to step 2342.

If, in step 2306, the current cdb node is not a cnode, then control passes to step 2330. If in step 2330 the current cdb node is a wait node, then wait_count is incremented in step 2332 and control passes to step 2336. If, in step 2330, the current cdb node is not a wait node, then regular processing is performed to create a CDFG node in step 2334 and control passes to step 2336.

In step 2336, if there are more cdb nodes to process, then control passes to step 2306. Otherwise, a loop_latency variable in memory 104 for the loop is assigned to Max_wait_count and an initiation interval variable for the loop is assigned to wait_count in step 2338. In step 2340, the processor builds a "loop end" node in the CDFG and assigns it to cstep wait_count.

The output of step 920 of FIG. 7 is input to the scheduler, which uses the CDFG and the loop initiation interval and loop latency to schedule the nodes of the circuit being generated. In the described embodiment, all nodes except read/write operation nodes can "float", i.e., can be moved between csteps by the scheduler to allow the scheduler to create an efficient circuit design. In the CDFG, these nodes are always assigned a cstep value equal to the initial cteps in which they appear in the HDL as a "suggestion" to the scheduler. It will be understood by persons of ordinary skill in the art that the CDFG of FIG. 24 has been simplified for the sake of example and that the CDFG also includes, e.g., data flow arcs connecting the CDFG nodes that represent data flows in a similar manner to the data flows of FIG. 21.

FIG. 14 shows an example circuit synthesized from the CDFG of FIG. 24. FIG. 25 shows an example of placement of CDFG nodes in csteps without and with use of the delay clause. In the left column, which represents CDFG without the delay clause, CDFG nodes corresponding to write operation node 2114, read operation node 2109, and subtracter node 2110 are assigned to cstep 0. Similarly, CDFG nodes corresponding to adder node 2112, read operation node 2104, read operation node 2106, assignment node 2116 (and a CDFG loop_end node) are assigned to a second cstep 1. Generation of this CDFG representation causes the synthesizer to generate a circuit that has different timing characteristics than the characteristics generated by the circuit synthesizer when the source code includes a delay clause. The right column of FIG. 25 shows the assignment of CDFG nodes to cycles in accordance with the present invention. In this example, a write operation node corresponding to write operation node 2114 is moved into cstep 4 during the steps of FIG. 23. This modification of the process to generate the CDFG (possible because of an addition of a signal delay attribute to the data graph 2100) allows the synthesis process to generate a circuit that has cycle level simulation behavior that is substantially identical to that of the cycle level simulation behavior of the source HDL.

FIG. 26 shows an example of loop pipelining when the present invention is used. The figure shows an nth iteration of the loop and an n+1st iteration of the loop over time. As can be seen in the figure, the initial interval of successive iterations of the loop is equal to a number of wait statements (or "posedge" or "negedge" statements). The loop latency, is equal to the longest cycle delay from the beginning of the loop to a latest operation. The throughput of the pipelined loop is not decreased by use of delayed signal assignments. In general, the scheduler will schedule a circuit having the CDFG of FIG. 24 as a pipelined circuit because the loop latency is longer than the initiation interval.

In summary, use of delayed signal assignments allows behavioral synthesis to infer circuits with pipelined loops which have cycle level simulation behavior which matches that of the source HDL. Pipelined loops may include loop carry dependencies and/or I/O and/or memory accesses which must be scheduled correctly. The use of a placeholder node within a template is an efficient representation of such scheduling constraints.

What is claimed is:

1. A method performed by a data processing system having a memory, comprising the steps of:

parsing a text description of a circuit, said text description stored in the memory, said text description including a loop with a delayed signal assignment having a delay value;

translating said text description into a digital circuit representation in said memory, said digital circuit representation including a pipeline; and setting a latency of said pipeline equal to said delay value.

2. The method of claim 1, wherein said loop further includes N wait statements, where N is greater than zero, said method further comprising the step of setting an initiation interval of said pipeline equal to N.

3. The method of claim 1, wherein said text description is written in Verilog and said delayed signal assignment uses a Verilog "#" operator.

4. The method of claim [3] *2*, wherein said wait statements [use] *transition on* Verilog "@posedge" statements.

5. The method of claim [3] *2*, wherein said wait statements [use] *transition on* Verilog "@negedge" statements.

6. The method of claim of claim [1] *2*, wherein said text description is written in VHDL, said delayed signal assignment uses a VHDL "after" clause, and said wait statements use VHDL "wait" statements.

7. A method, performed by a data processing system having, a memory, of building a digital circuit representation including a pipeline in the memory from a textual description of a loop, comprising the steps of:

identifying a loop carry dependency in said loop;

identifying a producer operation of said loop carry dependency;

identifying a consumer operation of said loop carry dependency;

determining a number, n, of cycles within which said produce operation must be scheduled after said consumer operation;

instantiating a placeholder node in said memory;

node-locking said placeholder node so that it must be scheduled n cycles after said consumer operation; and constraining said producer operation to be scheduled before said placeholder node.

8. The method of claim 7, wherein the step of node-locking said placeholder node further comprises the step of creating a template structure in said memory which includes said placeholder node and said consumer operation.

9. The method of claim 8, wherein said producer operation is included in a second template structure in said memory, and wherein the step of constraining said producer operation further comprises the step of constraining said second template structure to be scheduled before said template structure.

10. The method of claim 7, wherein n is equal to an initiation interval of said pipeline multiplied by a number of iterations of said loop which execute before data produced by said producer *operation* is consumed by said consumer *operation*.

11. A method, performed by a data processing system having a memory, of building a digital circuit representation in said memory, said digital circuit representation including a pipeline derived from a textual description of a loop, said method comprising the steps of:

identifying an access dependency of said loop;

identifying a first access operation of said access dependency;

identifying a second access operation of said access dependency;

determining a number, n, of cycles within which said second access operation must be scheduled after said first access operation;

instantiating a placeholder node in said memory;

node-locking said placeholder node so that it must be scheduled n cycles after said first access operation; and constraining a scheduling order of said second access operation and said placeholder node.

12. The method of claim 11, wherein said first access operation is chosen from [the] *a* group of access operations including a memory read, a memory write, a signal write and a port write, said second access operation is chosen from the group of access operations including a memory read, a memory write, a signal read, a signal write, a port read and a port write, and the step of constraining said scheduling order of said second access operation and said placeholder node further includes the step of forcing said second access operation to be scheduled before said placeholder node.

13. The method of claim 11, wherein said first access operation is chosen from [the] *a* group of access operations including a memory read, a memory write, a signal read, a signal write, a port read and a port write, said second access operation is chosen from the group of access operations including a memory read, a memory write, a signal write and a port write, and the step of constraining said scheduling order of said second access operation and said placeholder node further includes the step of forcing said second access operation to be scheduled before said placeholder node.

14. The method of claim 11, wherein said first access operation is chosen from [the] *a* group of access operations including a signal read and a port read, said second access operation is chosen from the group of access operations including a signal read and a port read, and the step of constraining said scheduling order of said second access operation and said placeholder node further includes the step of forcing said second access operation to be scheduled simultaneous with, or before said placeholder node.

15. The method of claim 11, wherein the step of constraining said scheduling order of said second access operation and said placeholder node further includes the step of forcing said second access operation to be scheduled before said placeholder node.

16. The method of claim 11, wherein the step of node-locking said placeholder node further includes the step of creating a template which includes said placeholder node and said first access operation.

17. The method of claim 11, wherein n is equal to an initiation interval of said pipeline multiplied by a number of iterations of said loop which execute between said first access operation and said second access operation.

18. A system for building, in a memory, a digital circuit representation which implements the behavior of a text description in said memory, said system having a processor coupled to a memory unit wherein said processor is programmed to perform logic processing, said system comprising:

parsing logic for parsing said text description into a parsed text description, said text description including a loop with a delayed signal assignment having a delay value;

translating logic for translating said parsed text description into said digital circuit representation, said digital circuit including a pipeline; and latency setting logic for setting a latency value of said pipeline to be said delay value of said delayed signal assignment.

19. A system as described in claim 18, wherein said pipeline implements said loop.

20. A system as described in claim 19, wherein said loop further includes a number, n, of wait statements, said system further comprising initiation interval setting logic for setting an initiation interval of said pipeline to be equal to n.

21. A computer program product comprising:

a computer usable medium having computer readable code embodied therein for building a digital circuit representation from a text description of a digital circuit, the computer program product comprising:

computer readable program code devices configured to cause a computer to effect parsing said text description, said text description including a loop with a delayed signal assignment having a delay value;

computer readable program code devices configured to cause a computer to effect translating said text description into said digital circuit representation including a pipeline; and computer readable program code devices configured to cause a computer to effect setting a latency of said pipeline equal to said delay value.

22. The computer program product of claim 1 wherein said loop further includes N wait statements, where N is greater than zero, said computer program product further comprising computer readable program code devices configured to cause a computer to effect setting an initiation interval of said pipeline equal to N.

*23. The method of claim 1, wherein said loop further includes N clock statements, where N is greater than zero, said method further comprising the step of setting an initiation interval of said pipeline equal to N.*

*24. A system as described in claim 18, wherein said loop further includes a number, n, of clock statements, said system further comprising initiation interval setting logic for setting an initiation interval of said pipeline to be equal to n.*

*25. The computer program product of claim 21 wherein said loop further includes N clock statements, where N is greater than zero, said computer program product further comprising computer readable program code devices configured to cause a computer to effect setting an initiation interval of said pipeline equal to N.*

*26. A method performed by a data processing system having a memory, comprising the steps of:*

*parsing a text description of a circuit, said text description stored in the memory, said text description including a loop with N wait statements, where N is greater than zero;*

*translating said text description into a digital circuit representation in said memory, said digital circuit representation including a pipeline; and*

*setting an initiation interval of said pipeline equal to N.*

*27. The method of claim 26, wherein the wait statements are VHDL wait statements.*

*28. The method of claim 26, wherein the wait statements transition on Verilog HDL @posedge statements.*

*29. The method of claim 26, wherein the wait statements transition on Verilog HDL @negedge statements.*

*30. A system for building, in a memory, a digital circuit representation which implements the behavior of a text description in said memory, said system having a processor coupled to a memory unit wherein said processor is programmed to perform logic processing, said system comprising:*

*parsing logic for parsing said text description into a parsed text description, said text description including a loop with N wait statements, where N is greater than zero;*

*translating logic for translating said parsed text description into said digital circuit representation, said digital circuit including a pipeline; and*

*initiation interval setting logic for setting an initiation interval of said pipeline equal to N.*

*31. The system of claim 30, wherein the wait statements are VHDL wait statements.*

*32. The system of claim 30, wherein the wait statements transition on Verilog HDL @posedge statements.*

*33. The system of claim 30, wherein the wait statements transition on Verilog HDL @negedge statements.*

*34. A computer program product comprising a computer usable medium having computer readable code embodied therein for building a digital circuit representation from a text description of a digital circuit, the computer program product comprising:*

*computer readable program code devices configured to cause a computer to effect parsing said text description, said text description including a loop with N wait statements, where N is greater than zero;*

*computer readable program code devices configured to cause a computer to effect translating said text description into said digital circuit representation including a pipeline; and*

*computer readable program code devices configured to cause a computer to effect setting an initiation interval of said pipeline equal to N.*

*35. The method of claim 34, wherein the wait statements are VHDL wait statements.*

*36. The method of claim 34, wherein the wait statements transition on Verilog HDL @posedge statements.*

*37. The method of claim 34, wherein the wait statements transition on Verilog HDL @negedge statements.*

*38. A method performed by a data processing system having a memory, comprising the steps of:*

*parsing a text description of a circuit, said text description stored in the memory, said text description including a loop with N clock statements, where N is greater than zero;*

*translating said text description into a digital circuit representation in said memory, said digital circuit representation including a pipeline; and*

*setting an initiation interval of said pipeline equal to N.*

*39. A system for building, in a memory, a digital circuit representation which implements the behavior of a text description in said memory, said system having a processor coupled to a memory unit wherein said processor is programmed to perform logic processing, said system comprising:*

*parsing logic for parsing said text description into a parsed text description, said text description including a loop with N clock statements, where N is greater than zero;*

*translating logic for translating said parsed text description into said digital circuit representation, said digital circuit including a pipeline; and*

*initiation interval setting logic for setting an initiation interval of said pipeline equal to N.*

*40. A computer program product comprising a computer usable medium having computer readable code embodied therein for building a digital circuit representation from a text description of a digital circuit, the computer program product comprising:*

*computer readable program code devices configured to cause a computer to effect parsing said text description, said text description including a loop with N clock statements, where N is greater than zero;*

*computer readable program code devices configured to cause a computer to effect translating said text description into said digital circuit representation including a pipeline; and*

*computer readable program code devices configured to cause a computer to effect setting an initiation interval of said pipeline equal to N.*

* * * * *